United States Patent
Lutsen et al.

(10) Patent No.: US 8,518,735 B2
(45) Date of Patent: Aug. 27, 2013

(54) METHODS FOR CONTROLLING THE CRYSTALLINE NANOFIBRE CONTENT OF ORGANIC LAYERS USED IN ORGANIC ELECTRONIC DEVICES

(75) Inventors: Laurence Lutsen, Coudekerque-Branche (FR); Wibren Oosterbaan, Hasselt (BE); Sabine Bertho, Hasselt (BE); Dirk Vanderzande, Hasselt (BE)

(73) Assignees: IMEC, Leuven (BE); Universiteit Hasselt, Diepenbeek (BE)

( * ) Notice: Subject to any disclaimer, the term of this patent is extended or adjusted under 35 U.S.C. 154(b) by 213 days.

(21) Appl. No.: 13/132,304

(22) PCT Filed: Dec. 18, 2009

(86) PCT No.: PCT/EP2009/067527
§ 371 (c)(1),
(2), (4) Date: Jun. 1, 2011

(87) PCT Pub. No.: WO2010/070101
PCT Pub. Date: Jun. 24, 2010

(65) Prior Publication Data
US 2011/0237020 A1    Sep. 29, 2011

Related U.S. Application Data

(60) Provisional application No. 61/140,542, filed on Dec. 23, 2008.

(30) Foreign Application Priority Data

Dec. 18, 2008 (EP) .................................... 08172150
Mar. 30, 2009 (EP) .................................... 09156705

(51) Int. Cl.
*H01L 21/00* (2006.01)

(52) U.S. Cl.
USPC .................................... 438/82; 257/E31.003

(58) Field of Classification Search
USPC .................................... 438/82; 257/E31.003
See application file for complete search history.

(56) References Cited

U.S. PATENT DOCUMENTS

2006/0223947 A1* 10/2006 Olesik et al. ................ 525/328.1
2008/0236657 A1* 10/2008 Brabec et al. ................ 136/252

* cited by examiner

*Primary Examiner* — Alexander Ghyka
*Assistant Examiner* — Stanetta Isaac
(74) *Attorney, Agent, or Firm* — Knobbe Martens Olson & Bear, LLP

(57) ABSTRACT

The present invention relates in a first aspect to methods for producing a nanofibres-containing layer for use as an active layer in an organic electronic device. The method comprising the steps of:
a) first heating up a nanofibre-forming polymer in a solvent at a temperature $T_1$, then
b) cooling said solution down to a temperature $T_2$ at a rate less than 40° C./h thereby forming a dispersion comprising crystalline nanofibres of said nanofibre-forming polymer, then
c) raising the temperature of said dispersion to a temperature $T_3$ higher than $T_2$, but lower than said temperature $T_1$, and then
d) coating said dispersion on a substrate at said temperature $T_3$ thereby forming a layer for use as an element of said organic electronic device, wherein before step (d), a step of adding an electron acceptor to the solution or dispersion is performed.

27 Claims, 23 Drawing Sheets

METHODS FOR CONTROLLING THE CRYSTALLINE NANOFIBRE CONTENT OF ORGANIC LAYERS USED IN ORGANIC ELECTRONIC DEVICES

CROSS-REERENCE TO RELATED APPLICATIONS

This application is the national phase under 35 U.S.C. §371 of prior PCT International Application No. PCT/EP2009/067527 which has an International Filing Date of Dec. 18, 2009, which designates the United States of America, and which claims priority to U.S. Provisional Application No. 61/140,542 filed Dec. 23, 2008, EP Application No. 08172150.8 filed Dec. 18, 2008, and EP Application No. 09156705.7 filed Mar. 30, 2009, the disclosures of which are hereby expressly incorporated by reference in their entirety and are hereby expressly made a portion of this application.

TECHNICAL FIELD OF THE INVENTION

The present invention relates to the field of organic electronics and more particularly to the field of solar cell fabrication methods.

BACKGROUND OF THE INVENTION

Recently, it was shown that the film morphology of an active layer in bulk heterojunction solar cells, made with a blend of an electron donor material and an electron acceptor material, is of great importance for solar cell power efficiency. Yang et al showed that the blend Poly(3-hexylthiophene) (P36T)/[6,6]-phenyl-$C_{61}$-butyric acid methyl ester (PCBM) has a different nano-morphology if a post-heat treatment step is applied to the active layer (after its deposition). Post-heat treatment of the active layer brings about a heterogeneous morphology with polymer-rich and PCBM-rich zones (X. Yang et al, Nanoletters, 2005, vol.5, p. 579). Recently, a new method for the preparation of active layers of polymeric solar cells, without the need for thermal post-treatment, was disclosed (S. Berson et al, WO 2007/048909 also, Adv. Funct. Mater, vol. 17, iss. 8, p. 1377-1384). Poly(3-hexylthiophene) (P36T) nano-fibres were prepared as a highly concentrated dispersion in a solution of low molecular weight P36T. The crystalline nanofibre concentration in the dispersions was strongly dependent on the molecular weight of the starting polymer as only the high molecular weight fraction forms nano-fibers, (the low molecular weight polymer fraction stays in solution).

WO2007/048909 discloses a process for preparing a polymeric composition having photovoltaic properties comprising a step of mixing in a solvent at least one electron donating polymeric semiconductor substantially in the form of nanofibres and an electron accepting material in the solvent, said nanofibres representing at least 10% in weight of the electron-donating polymeric semiconductor material. However, the control of the nano-fiber content using this method is very tedious and labour-intensive as it involves a large number of steps.

SUMMARY OF THE INVENTION

Surprisingly, it has been found that the crystalline nanofibre content of an organic active layer of an organic electronic device, such as an opto-electronic device (e.g. a solar cell), can be adjusted via an easy and quick method involving a particular pattern of temperature changes of a mother solution and/or dispersion rather than the more tedious and labour intensive methods of the prior art.

It is an object of the present invention to provide simple methods for producing crystalline nanofibres-containing active layers for use in organic electronic devices. In embodiments, the methods permit a precise control of the crystalline nanofibre content and/or comprise only a limited number of steps. It is an advantage of embodiments of the present invention to provide an easy and quick method to optimize the properties of organic electronic devices in general and the power efficiency of organic solar cells in particular.

It is an advantage of embodiments of the present invention that the nanomorphology of an active layer can be controlled towards efficient organic devices by an easily controllable method, not requiring time-consuming new formulations such as proposed in WO2007/048909.

The above objective is accomplished by a method according to the present invention.

A first aspect of the present invention relates to a method for producing a layer for use as an active layer in an organic electronic device, said layer comprising polymer nano-fibres, said method comprising the steps of:
a) first heating up a nanofibre-forming polymer in a solvent to a temperature $T_1$, then
b) cooling said solution down to a temperature $T_2$, for example in the range of 18° C. to 25° C., thereby forming a dispersion comprising crystalline nanofibres of said nanofibre-forming polymer, then
c) raising the temperature of said dispersion to a temperature $T_3$ higher than $T_2$, but lower than said temperature $T_1$, and
d) coating said dispersion on a substrate at said temperature $T_3$ thereby forming a layer for use as an element of said organic electronic device.

The method according to the first aspect of the present invention enables for instance the optimisation of the power efficiency of a photovoltaic device by means of an effective, easy and quick method.

In embodiments of the first aspect of the present invention, step a may comprise forming a solution of a nanofibre-forming polymer in a solvent at a temperature $T_1$, for instance by completely dissolving said nanofibre-forming polymer.

This is advantageous for P3AT when A is 6 or above, preferably 7 or above, more preferably from 8 to 9. In such cases $T_1$ can be $T_{m.d.}$.

In embodiments of the first aspect of the present invention, after step (c) and before step (d), a step (c') of maintaining said dispersion at said temperature $T_3$ for a period long enough to achieve a stable crystalline nanofibre content in said dispersion may be performed.

In embodiments of the first aspect of the present invention the nanofibre-forming polymer may be a conjugated polymer.

In embodiments of the first aspect of the present invention, said conjugated polymer may be a hole transporting polymer.

In embodiments of the first aspect of the present invention, said organic electronic device may be a photovoltaic device.

In embodiments of the first aspect of the present invention, said conjugated polymer may be a homo- or co-polymer comprising one or more monomers selected from derivatives of thiophenes, selenophenes, thienylenevinylenes, phenylenes, phenylenevinylenes, anilines, fluorenes, indenofluorenes, quinoxaline, cyclopentadithiophene, benzothiodiazole, dithieno-silole, silafluorene, carbazole or may be a ladder-type poly(p-phenylene) among others.

In embodiments of the first aspect of the present invention, said conjugated polymer may have the following general formula (I):

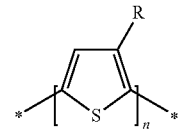

wherein R is hydrogen or a $C_1$-$C_{10}$ alkyl group, branched or linear or a $C_5$-$C_{10}$ cyclic alkyl group.

In embodiments of the first aspect of the present invention, the nanofibre-forming polymer may have a Mn of 10000 to 350000 g/mol when measured by gel permeation chromatography with polystyrene as standard.

In embodiments of the first aspect of the present invention where said organic electronic device is a photovoltaic device, the method may comprise the step of adding an electron acceptor e.g. to the solution or dispersion before any of steps (b), (c) or (d). Preferably, the addition of the electron acceptor is performed during step (a). This is advantageous as it permits the electron acceptor to be more easily dissolved at a higher temperature $T_1$ in a step in which no nanofibres are yet present. Adding the electron acceptor later in the method might require re-heating the solution and therefore redissolving the nanofibres formed.

In embodiments of the first aspect of the present invention said electron acceptor may be a fullerene derivative, preferably [6,6]-phenyl-$C_{61}$-butyric acid methyl ester.

In embodiments of the first aspect of the present invention at least step (a) may be performed in the dark and/or under inert atmosphere.

In embodiments of the first aspect of the present invention, the solvent may be a good solvent for the nanofibre-forming polymer at said temperature $T_1$ and a bad solvent for the nanofibre-forming polymer at said temperature $T_3$.

In embodiments of the first aspect of the present invention, the solution formed in (a) may comprise from 0.0001 wt % to 10 wt %, preferably from 0.001 to 5 wt %, most preferably from 0.01 to 2 wt % of nanofibre-forming polymer.

In embodiments of the first aspect of the present invention, the layer formed in (d) may have a thickness of from 10 nm to 1000 nm, preferably 20 nm to 300 nm.

In embodiments of the first aspect of the present invention, step (d) may be performed on a conductive surface of said solid substrate.

In embodiments of the first aspect of the present invention, it is an option that no annealing step is performed after step (d). This enables substrates to be used that may deteriorate physically or chemically at the glass transition temperature of said nanofibre-forming polymer e.g. flexible substrates and/or low stability substrates.

In embodiments of the first aspect of the present invention, the method may further comprise the step of adding an amorphous polymer e.g. before any of steps b), c) or d). This amorphous polymer could have n-type character, a different absorption maximum or act as a performance-enhancing diluent.

In embodiments of the first aspect of the present invention, said conjugated polymer may be an electron donor.

In embodiments of the first aspect of the present invention step (b) and/or step (c) may be operated at a rate of less than 40° C./hour.

In embodiments of the first aspect of the present invention, during step (b), a separation step (e.g. a filtration) for removing non fibre-like aggregates may be performed.

The ratio of crystalline nanofibres to dissolved nanofibre-forming polymer will depend upon the nanofibre-forming polymer used. In the case of P36T a ratio of 70:30 has been found to be particularly advantageous.

In embodiments of the first aspect of the present invention, said temperature $T_3$ may be from 40° C. to 50° C. It is advantageous as we could demonstrate that it is in this range of temperature that nanofibre-forming polymers among the most useful for use in solar cells (such as e.g. P36T) can be processed as a layer demonstrating close to optimum power efficiency in solar cells.

In embodiments of the first aspect of the present invention, $T_2$ may be lower than $T_1$ but higher than the freezing point of the solvent. For instance, $T_2$ can be at least −20° C. or at least 0° C.

In embodiments of the first aspect of the present invention, the temperature $T_1$ may be at least 20° C. lower, and preferably at least 25° C. lower than the temperature $T_{m.d.}$ at which said solvent completely dissolves said nanofibre-forming polymer.

In embodiments of the first aspect of the present invention, the temperature $T_1$ may be at most 60° C. lower and preferably at most 50° C. than the temperature $T_{m.d.}$ at which said solvent completely dissolves said nanofibre-forming polymer.

In embodiments of the first aspect of the present invention, the temperature T1 may be at least 50° C., preferably at least 60° C.

In embodiments of the first aspect of the present invention, the temperature T1 may be such that said nanofibre-forming polymer dissolves at least partially in said solvent at said temperature T1.

In embodiments of the first aspect of the present invention, the temperature T1 may be such that said nanofibre-forming polymer dissolves only partially in said solvent at said temperature T1.

In embodiments of the first aspect of the present invention, the temperature T1 may be such that solution of said nanofibre-forming polymer comprises less than 5%, preferably less than 1% and most preferably less than 0.1% aggregated nanofibre-forming polymer as measured by UV-Vis spectroscopy.

In embodiments of the first aspect of the present invention, T1 is such that solution of said nanofibre-forming polymer is turbid or not limpid. For instance, a turbid solution visibly scatters the light of a standard 670 nm laser pointer.

In embodiments of the first aspect of the present invention, wherein any of step (a) through (d) and preferably all steps (a) through (d) are performed under an inert atmosphere and/or dry atmosphere.

In embodiments of the first aspect of the present invention, when non-fibre-like aggregates (e.g.) form a gel upon cooling from $T_1$ to $T_2$ the solution can be heated up to a temperature $T_4$, high enough to make the gel disappear, before the cooling to $T_2$ is resumed. Preferably, $T_4$ is lower than $T_1$.

In embodiments of the first aspect of the present invention, the dispersion obtained in step (c) may comprise a ratio crystalline nanofibres to dissolved nanofibre-forming polymer of from 38:62 to 46:54. It is advantageous as we could demonstrate that it is in this range of concentration that nanofibre-forming polymers among the most useful for use in solar cells (such as e.g. P36T) can be processed as a layer demonstrating close to optimum power efficiency in solar cells.

A preferred embodiment of the first aspect of the present invention relates to a method for producing a layer for use as an active layer in an organic electronic device, the layer comprising polymer nano-fibres, the method comprising the steps of:

a) first forming a solution of a nanofibre-forming polymer in a solvent at a temperature $T_1$, preferably by completely dissolving said nanofibre-forming polymer, then b) cooling said solution down to a temperature $T_2$ at a rate less than 40° C./h, for example in the temperature range of 18° C. to 25° C., thereby forming a dispersion comprising crystalline nanofibres of the nanofibre-forming polymer, then c) raising the temperature of the dispersion to a temperature $T_3$ higher than $T_2$, but lower than the temperature $T_1$, and then d) coating the dispersion on a substrate at the temperature $T_3$ thereby forming a layer for use as an element of the organic electronic device, wherein before step (d), a step of adding electron acceptor to the solution or dispersion is performed.

In a second aspect, the present invention relates to an organic electronic device comprising a polymer layer obtainable by the method of any embodiment according to the first aspect of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The teachings of the present invention permit the design of improved methods for manufacturing active layers having a well-controlled crystalline nanofibre content.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 24 comprises the information present in FIG. 19.

DESCRIPTION OF ILLUSTRATIVE EMBODIMENTS

Figure 1:
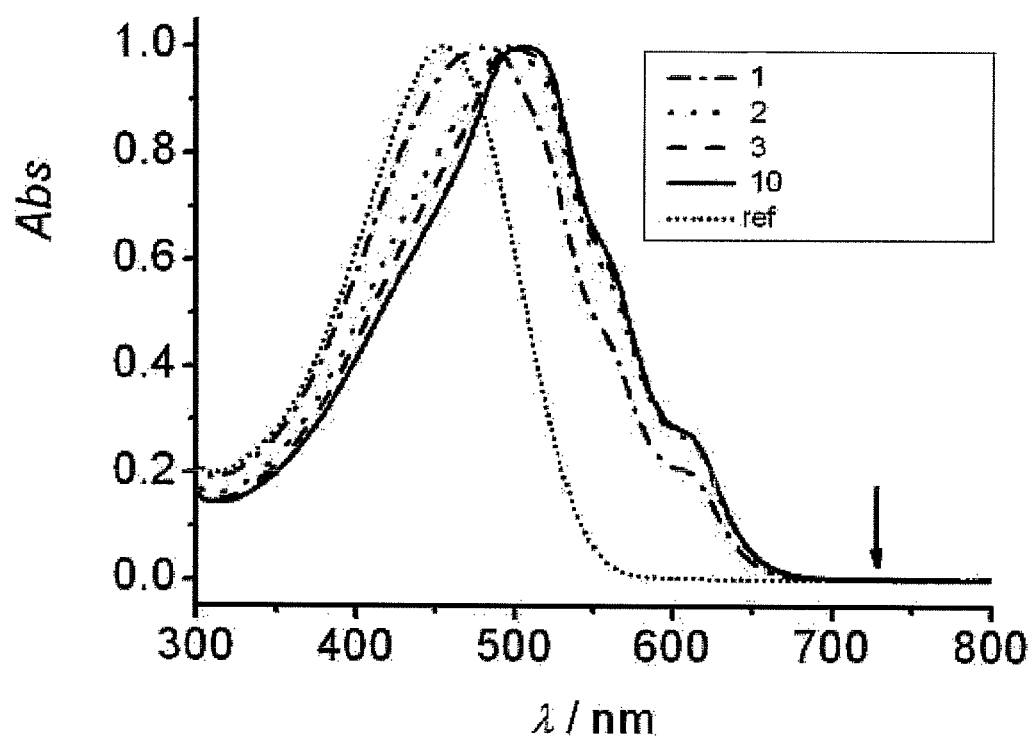
FIG. 1 is a graph showing curves, taken at different times, of the normalized absorbance versus the wavelength (nm) for a polymer dispersion of P34T (0.5% wt) in chlorobenzene obtained in step (b) of embodiments of the method according to the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless otherwise stated, the term "active layer" designates a layer (e.g. an organic layer) which includes at least one semiconductor material (e.g. an organic semiconductor material) exhibiting one type of electronic conductivity (electon or hole conduction) and optionally a second or further semiconductor material having the same or opposite type of conductivity.

As used herein and unless provided otherwise, the term "organic electronic device" refers to an electronic device having at least one organic layer which is an active layer. Examples of organic electronic devices include but are not limited to opto-electronic devices (such as photovoltaic devices, light emitting diodes, lasers, phototransistors, photodetectors and optocouplers amongst others), organic field effect transistors (OFETs) and memory elements.

As used herein, and unless provided otherwise, the term "mother solution" or "mother polymer solution" relates to a nanofibre-forming polymer substantially entirely dissolved in a solvent at a temperature $T_1$ higher than $T_2$ ($T_2$ is in the range 0° C.-25° C. and is preferably in the range 18° C.-25° C.), wherein the solvent is such that the nanofibre-forming polymer is not entirely soluble at a temperature $T_3$ comprised between $T_2$ (e.g. 18° C. or preferably 25° C.) and said temperature $T_1$. Typically, a mother polymer solution is a solution obtained at step (a) of the method according to embodiments of the present invention.

As used herein and unless provided otherwise, the term "mother polymer dispersion" designates a polymer dispersion at room temperature having a pre-defined quantity of nanofibers and a pre-defined quantity of a well soluble polymer fraction. These quantities are dependent on the molecular weight of the starting polymer, the solvent used and the concentration of the starting polymer in the solvent, this is an intrinsic characteristic thermodynamically driven. Typically, such mother polymer dispersion can be obtained by cooling down to room temperature (between 18° C. and 25° C.) a mother polymer solution. This typically appends in step (b) of embodiments of the present invention.

As used herein and unless otherwise stated, the term "polymer dispersion" or "nano-fibre forming polymer dispersion" relates to a mixture of a nanofibre-forming polymer and a solvent, said mixture comprising:
(i) a first quantity of a first portion of said nanofibre-forming polymer dispersed as crystalline nanofibres in said solvent, and
(ii) a second quantity of a second portion of said nanofibre-forming polymer dissolved in said solvent.

These quantities are dependent on the molecular weight and the molecular weight distribution of the starting polymer, the solvent used and the concentration of the starting polymer in the solvent, this is an intrinsic, thermodynamically driven, characteristic of the solution.

As used herein and unless provided otherwise, the term "polymer suspension" relates to a stable "polymer dispersion", i.e. a polymer dispersion wherein the crystalline nanofibres do not settle.

As used herein and unless provided otherwise, the term "polymer composition" relates to a polymer solution/dispersion/blend comprising a guest material (e.g. an electron acceptor).

As used herein with respect to polymer dispersion, and unless otherwise stated, the term "new formulation" designates the mixture of a given quantity of (previously) isolated crystalline nanofibres of a nanofibre-forming polymer with a given quantity of this same nanofibre-forming polymer in solution (generally the molecular weight of the polymer which give crystalline nanofibres is higher than the molecular weight of the polymer which is in solution).Typically, new formulations are obtained by following the teaching of WO2007/048909.

As used herein with respect to device process, and unless otherwise stated, the term "thermal annealing" refers to a heat treatment applied to the layer after the layer is deposited/processed (see Journal of Materials chemistry 2007, 17(30), 3126-3140)

As used herein with respect to device process, and unless otherwise stated, the term "solvent annealing" refers to a solvent vapor treatment wherein the layer is exposed at room temperature or at a higher temperature to an atmosphere comprising solvent vapors (see Journal of Materials chemistry 2007, 17(30), 3126-3140.

As used herein and unless provided otherwise, the term "nanofibre-forming polymer" relates to a polymer material sufficiently high Mn chains of which have the ability to self-assemble in the form of crystalline nanofibres in at least one solvent at at least one temperature comprised between room temperature and the boiling point of that solvent. Whether crystalline nanofibes can be potentially formed with a "nanofibre-forming polymer" is therefore dependent upon the choice of solvent, temperature and polymer molecular weight distribution. Moreover, that portion of the "nanofibre-forming polymer" which does not form cystalline nanofibres under the layer-forming conditions will be present as an amorphous phase, whether or not under other conditions it potentially has the possibility of itself forming crystalline nanofibres.

As used herein and unless provided otherwise, the term "crystalline nanofibre" relates to elongated crystalline structures having a cross section (e.g. in the case of angular fibers having edges) or diameter (e.g. in the case of rounded crystalline nanofibres) less than 1 micron, preferably less than 50 nm with less than 30 nm being particularly preferred, and a length less than 100 μm with less than 10 μm being preferred and less than 5 μm being particularly preferred. Typical nanofibres have widths of 15 to 30 nm, heights of 2 to 10 nm and lengths of 0.5 to 5 μm.

As used herein and unless provided otherwise, the term "hole transporting polymer" relates to a semi-conducting polymer whose ability to transport holes is higher than its ability to transport electrons.

As used herein and unless provided otherwise, the term "electron donor" refers to a compound capable of donating one or more electrons to an electron acceptor. Similarly, the term "electron acceptor" refers to a compound capable of accepting one or more electrons from an electron donor. For a donor to be thermodynamically able to transfer an electron to an acceptor, the energy levels of the donor and the acceptor preferably fulfil the following inequality: $(\Delta L - \Delta ex) > (Intra\ D - Intra\ A)$, wherein $\Delta L$ is the energy difference between the donor and the acceptor's Lowest Unoccupied Molecular Orbital (LUMO), wherein the donor's LUMO is higher in energy than the acceptor's LUMO, and wherein Intra D and Intra A are the bandgap energies of the donor and the acceptor respectively. The bandgap energy of a compound is the difference in energy between the LUMO energy level and and the HOMO energy level of said compound. $\Delta ex$ is an additional energy experimentally found to be necessary for the electron transfer to occur. $\Delta ex$ depends on the particular donor-acceptor couple but is usually about 0.5 eV.

As used herein and unless provided otherwise, the term "ladder-type poly(p-phenylene)" relates to a bridged poly(p-phenylene) derivative wherein every pair of adjacent phenylene units is bridged by methylene units. An example is the methyl-substituted ladder-type poly(para-phenylene) (MeLPPP)

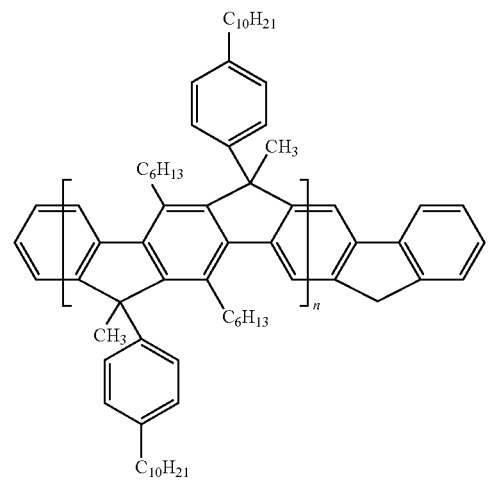

shown below:

As used herein and unless provided otherwise, the term "inert atmosphere" refers to an atmosphere, which is non-reactive towards the particular nanofibre-forming polymer at the particular temperature. An inert atmosphere can be composed of inert gas and/or be an atmosphere free of a reactive component such as water. Examples of suitable atmospheres are an atmosphere of a particular inert gas, such as argon atmosphere or nitrogen ($N_2$), or a mixture of inert gases. Preferably, the inert gas is free of reactive species such as water.

As used herein, $T_{m.d.}$ is the lowest temperature at which a given solvent completely dissolves a given amount of a given nanofibre-forming polymer.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In a first aspect, the present invention relates to a method for producing a layer comprising crystalline polymer nanofibres. The layer is an organic layer optionally comprising one or more inorganic components. The layer will generally comprise one or more crystalline phases and one or more amorphous phases. At least one of the crystalline phases comprises crystalline nanofibres of a nanofibre-forming polymer and at least one of the amorphous phases originates from the same nanofibre-forming polymer. Preferably, the layer comprises a crystalline phase comprising crystalline nanofibres of a nanofibre-forming polymer and an amorphous phase of the same nanofibre-forming polymer with optionally an additional amorphous phase originating from a different organic material. In embodiments, the layer formed in step (d) has a thickness of from 10 nm to 1000 nm, preferably 20 nm to 300 nm. In the layer, the crystalline nanofibre content (wt %) of the nanofibre-forming polymer may be 1% or more, preferably 10% or more, more preferably 20% or more, still more preferably 30% or more or 35% or more and most preferably 38% or more. The crystalline nanofibre content of the nanofibre-forming polymer may be 95% or less, preferably 90% or less, more preferably 85% or less and most preferably 80% or less, 70% or less or 60% or less, wherein any of those upper limits can be combined with any of the lower limits above. The optimum nonfibre content is dependent upon the ratio of electron donating polymeric semiconductor to electron accepting compound. An example of advantageous crystalline nanofibre content of the nanofibre-forming polymer in the layer is from 35% to 60%, another example is from 38% to 46% This last ratio is particularly suitable where the nanofibre forming polymer is P36T for a 1:1 weight ratio with PCBM. In embodiments of the present invention, the nanofibre-forming polymer may be a conjugated polymer. In embodiments of the present invention, the conjugated polymer may be a homo- or co-polymer comprising one or more monomers selected from derivatives of thiophenes, selenophenes, thienylenevinylenes, phenylenes, phenylenevinylenes, anilines, fluorenes, indenofluorenes, quinoxaline, cyclopentadithiophene, benzothiodiazole, dithieno-silole, silafluorene, carbazole or may be a ladder-type poly(p-phenylene) among others. In embodiments of the present invention, the nanofibre-forming polymer may be selected from polythiophenes, polythienylenevinylene, polyphenylenes, polyselenophenes, polyphenylene vinylenes, polyanilines, polyfluorenes, polyindenofluorenes, among others. In embodiments of the present invention, the conjugated polymer may have the following general formula (I):

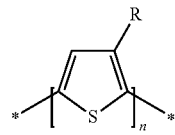

wherein R is a $C_3$-$C_{20}$ alkyl group, branched or linear or a $C_5$-$C_9$ cyclo-alkyl group. Preferably, R is a $C_3$-$C_{16}$ alkyl group, branched or linear. This embodiment is advantageous as adequate solvent is easier to find for less soluble polymer derivatives. In embodiments of the present invention, the conjugated polymer may be a hole transporting polymer. In embodiments of the present invention, the conjugated polymer may be a electron donor. In embodiments, the nanofibre-forming polymer may have a Mn from 10000 to 200000 g/mol. In embodiments of the present invention, the Mn may be 10000 g/mol or more, 15000 g/mol or more, 20000 g/mol or more, 25000 g/mol or more. Combined with any of these lower limits for the Mn, the Mn may be 200000 g/mol or less, 100000 g/mol or less or 60000 g/mol or less. These Mn are measured by gel permeation chromatography with polystyrene as standard. In embodiments of the present invention, the nanofibre-forming polymer (e.g. a polymer according to formula (I)) is regioregular. In addition to the crystalline nanofibre-forming polymer, the layer may further comprise other components. For instance, it can comprise an electron acceptor component. This is especially advantageous in embodiments wherein the layer is for use as an active layer in a photovoltaic device.

Well-known electron acceptor materials are fullerenes and/or fullerene derivatives. However, other materials like, for example, cyano-substituted conjugated polymers (e.g. CN-MEH-PPV (poly-[2-methoxy-5-(2'-ethylhexyloxy)-1,4-(1-cyanovinylene)-phenylene])), benzothiadiazole-comprising conjugated polymers (e.g. F8TB (poly(9,9'-dioctlyfluoreneco-benzothiadiazole)) or perylene based small molecules (e.g. perylene dicarboxyimide derivatives) are also considered as electron acceptors. In an embodiment, the electron acceptor may be a fullerene derivative, preferably [6,6]-phenyl-$C_{61}$-butyric acid methyl ester. The layer may also comprise an additional amorphous component. The additional amorphous component can serve as a diluent and can help in preventing aggregation of the crystalline nanofibres. The additional amorphous component is preferably a conjugated polymer or conjugated oligomer.

The layer may typically be for use as an active layer in an organic electronic device. For instance, it can be for use in field effect transistors or in optoelectronic devices such as photovoltaic devices, or light emitting diodes. Preferably, it is for use in photovoltaic devices. Embodiments wherein the layer comprises an electron acceptor guest are particularly suited for use in photovoltaic devices. The devices referred to here comprise at least one active organic layer, they may be referred to as organic devices (e.g. organic photovoltaic device).

In an embodiment of the first aspect, the method comprises the steps of:
a) heating up a nanofibre-forming polymer in a solvent at a temperature $T_1$,
b) cooling said solution down to a temperature $T_2$, for example in the range of 18° C. to 25° C., thereby forming a dispersion (e.g. a suspension) comprising crystalline nanofibres of said nanofibre-forming polymer,
c) raising the temperature of said solution to a temperature $T_3$ higher than $T_2$ (e.g. higher than 18° C., preferably higher than 25° C.), but lower than said temperature $T_1$, and
d) coating said dispersion on a substrate at said temperature $T_3$ thereby forming a layer for use as an element of said organic electronic device.

Step (a)

In embodiments, the solution formed in (a) may comprise from 0.0001 wt % to 10 wt %, preferably from 0.01 to 5 wt %, most preferably from 0.01 to 2 wt % of nanofibre-forming polymer. The polymer solution may also comprise other components in addition to the nanofibre-forming polymer and the solvent. For instance it can comprise one or more electron acceptor compound as defined above. In embodiments, the electron acceptor compound may be added to the polymer solution (during step (a)) or dispersion (during step (b) or step (c)) as a soluble material or as an insoluble material, preferably as a soluble material. Preferably, once an electron acceptor compound is added to either the solution or the suspension, the solution or suspension is allowed to reach a new equilibrium state before performance of step (d). If the electron acceptor compound is added during step (a), the equilibrium can be reached either during step (a), after (b) but before step (c) or after step (c) but before step (d). The equilibrium is preferably reached under stirring. The time necessary to achieve equilibrium after addition of an electron acceptor compound may vary considerably but between one and 5 hours is normally sufficiently long. For instance, two hours can be used. The total amount of electron accepting compounds in the solution or dispersion may be from 0.0001 wt % to 10 wt %, 0.01 wt % to 5 wt %, preferably from 0.01 to 2 wt %. The ratio donor/acceptor is preferably from 1/1 to 1/4. Examples of usable solvents include aromatic solvents such as non-halogenated aromatic or heteroaromatic solvents (such as but not limited to methylnaphthalene, acetophenone, p-xylene, o-xylene, benzyl ether, tetralin(1,2,3,4-Tetrahydronaphthalene), 1,2,4-trimethylbenzene, anisole) or halogenated aromatic or heteroaromatic solvents (such as but not limited to bromobenzene, chlorobenzene, o-chlorotoluene, 1,2-dichlorobenzene, 1,3-dichlorobenzene, 1,4-dichlorobenzene, 1,2,4-trichlorobenzene, tetrachlorothiophene), cyclic or polycyclic non-aromatic solvents (such as but not limited to (1S)-(−)-a-Pinene, pinane, decalin, cyclohexanone or methylcyclohexane among others), aliphatic solvents such as non-halogenated aliphatic solvents (such as but not limited to pentane, hexane, heptane, octane, decane and dodecane) or halogenated aliphatic solvents (such as but not limited to trichloromethane, dichloromethane, tetrachloroethylene), $CS_2$, aliphatic alcohols, water or mixture thereof among others.

In embodiments, step (a) can be: forming a solution by dissolving a nanofibre-forming polymer in a solvent at a temperature $T_1$ high enough to enable the formation of said solution.

In an embodiment, the solvent is a good solvent for the nanofibre-forming polymer at said temperature $T_{m.d.}$, i.e. the solvent dissolves said nanofibre-forming polymer completely at said temperature $T_{m.d.}$, and a bad solvent for the nanofibre-forming polymer at said temperature $T_3$, i.e. the solvent cannot keep the nanofibre-forming polymer entirely in solution at said temperature $T_3$ and part of said nanofibre-forming polymer is present as crystalline nanofibres (in a stable way) at this temperature. In an embodiment, the temperature $T_1$ may be lower than the boiling point of the solution. In embodiments, the absolute value of $T_1$ depends on the nanofibre-forming polymer used and on the solvent used. Typically, $T_1$ may be high enough to permit the dissolution of at least 95% of the nanofibre-forming polymer and is at or is lower than the boiling point of the solvent. Preferably $T_1$ is not high enough to obtain a clear aggregate-free solution. In embodiments of the first aspect of the present invention, the temperature $T_1$ may be at least 20° C. lower, and preferably at least 25° C. lower than the temperature $T_{m.d.}$ at which said solvent completely dissolves said nanofibre-forming polymer.

In embodiments of the first aspect of the present invention, the temperature $T_1$ may be at most 60° C. lower and preferably at most 50° C. than the temperature $T_{m.d.}$ at which said solvent completely dissolves said nanofibre-forming polymer.

In embodiments of the first aspect of the present invention, the temperature T1 may be at least 50° C., preferably at least 60° C.

In embodiments of the first aspect of the present invention, the temperature T1 may be such that said nanofibre-forming polymer dissolves at least partially in said solvent at said temperature T1.

In embodiments of the first aspect of the present invention, the temperature T1 may be such that said nanofibre-forming polymer dissolves only partially in said solvent at said temperature T1.

In embodiments of the first aspect of the present invention, the temperature T1 may be such that solution of said nanofibre-forming polymer comprises less than 5%, preferably less than 1% and most preferably less than 0.1% aggregated nanofibre-forming polymer as measured by UV-Vis spectroscopy. In UV-Vis spectroscopy of nanofibre-forming polymers, aggregates are responsible for a peak or a shoulder at a longer wavelength than the peak corresponding to the absorption maximum of the nanofibre-forming polymer. The concentration C (in g/l) of non-aggregated nanofibre-forming polymer in an aggregate-free solution is proportional to the absorption A at the wavelength of the peak corresponding to the absorption maximum of the nanofibre-forming polymer. Once the factor linking A and C is established by analysing one or more clear aggregate-free solutions, this factor can be used to evaluate the concentration of non-aggregated nanofibre-forming polymer in a solution comprising aggregates. Subtracting this concentration from the concentration calculated from the amount of nano-fibre forming polymer that was actually used to form the solution (nominal concentration) gives the concentration of aggregated nanofibre-forming polymer. The ratio of this concentration of aggregated nanofibre-forming polymer to the nominal concentration can therefore be calculated.

Step (b)

In an embodiment of the present invention, the cooling is first operated down to a temperature $T_2$ lower than the coating temperature $T_3$ (e.g. down to room temperature) before it is raised to the coating temperature $T_3$. In some embodiments, the difference between $T_1$ and $T_2$ is preferably 25° C. or more and preferably 30° C. or more. In any embodiment of the present invention, the cooling of the solution from the temperature $T_1$ to the temperature $T_2$ is preferably slow. A slower cooling is favourable to the self assembly of the polymer chains to form crystalline nanofibres. This cooling can for instance take hours or days. Preferably, the temperature is decrease at a rate of less than 40° C./hour, preferably less than 30° C./hour, most preferably less than 25° C./hour. Preferably the temperature is decreased at a rate of more than 5° C./hour, preferably more than 10° C./hour, most preferably more than 15° C./hour. Any higher limits of the cooling rate can be combined with any lower limit of the cooling rate. In embodiments of the first aspect of the present invention, $T_2$ is lower than $T_1$ but higher than the freezing point of the solvent. For instance, $T_2$ can be at least −20° C. or at least 0° C. The freezing temperature of the solvent can be varied by using a mixture of solvents.

Step (c)

The crystalline nanofibre content of the polymer dispersion is adjusted by setting the temperature of the dispersion to an appropriate value, higher than $T_2$, before coating. Higher temperature values will lead to lower crystalline nanofibre contents. The step (c) of raising the temperature of said solution to a temperature $T_3$ higher than $T_2$ (e.g. higher than room temperature) is preferably operated by slowly heating the solution. A slower heating is favourable. This heating can for instance take minutes, hours or days. Preferably, the temperature is increased at a rate of less than 40° C./hour, preferably less than 30° C./hour, most preferably less than 25° C./hour. Preferably the temperature is increased at a rate of more than 5° C./hour, preferably more than 10° C./hour, most preferably more than 15° C./hour. Any higher limits of the heating rate can be combined with any lower limit of the heating rate. In embodiments, the difference between T3 and T2 is 1° C. or more, preferably 3° C. or more, more preferably 5° C. or more.

The coating temperature $T_3$ will determine the crystalline nanofibre content of the coated layer for a given mixture.

The same mother solution/dispersion can be used to get more than one polymer dispersions. To this effect, the dispersion is set at different temperatures $T_3, T_3', T_3'', \ldots$ and part of the dispersion is used to perform step (d) at each of said temperature $T_3, T_3', T_3'', \ldots$.

In an embodiment, before the performance of step (d), the crystalline nanofibre content of the dispersion is checked. An embodiment of the present invention therefore includes a step of monitoring or assessing the crystalline nanofibre content of the polymer dispersion during or just before the performance of step (d). This monitoring or assessing step can be performed directly or indirectly e.g. by using UV/Vis absorption spectroscopy or any other means known to the person skilled in the art for monitoring the presence of crystalline nanofibres or the content of the nanofibre-forming polymer dissolved in the dispersion media.

At the end of step (c), when the temperature $T_3$ is achieved, a particular weight ratio of crystalline nanofibres to the dissolved nanofibre-forming polymer is obtained. This weight ratio may be 1% or more, preferably 10% or more, more preferably 20% or more, still more preferably 30% or more or 35% or more and most preferably 40% or more. This weight ratio may be 95% or less, preferably 90% or less, more preferably 85% or less and most preferably 80% or less, 70% or less or 60% or less, wherein any of those upper limit can be combined with any of the lower limit above. An example of advantageous crystalline nanofibre content of the nanofibre-forming polymer in the layer is from 15% to 60%, preferably from 35% to 60%, more preferably from 35% to 55%, another example is from 38% to 46%. This last ratio is particularly suitable where the nano-fibre forming polymer is P36T. This weight ratio depends on the molecular weight and the molecular weight distribution of the starting nanofibre-forming polymer for a given solvent and temperature as only a relatively higher molecular weight fraction of the nanofibre-forming polymer actually self assemble towards crystalline nanofibres. The relatively lower molecular weight fraction of the nanofibre-forming polymer stays in solution and will lead to an amorphous phase after the performance of step (d).

Step (d)

Any coating method known in the art can be used such as e.g. dipping, spin-coating, printing (e.g. ink-jet printing), gravure, screen-printing, among others. The dispersion can be coated as a single layer or multiple layers either coating simultaneously or non-simultaneously to form a multilayer. Preferably, step (d) is performed on a conductive surface of a solid substrate. The substrate can be formed of one material or of more than one material. For instance, the substrate can comprise a conductive material optionally coated with one or more conductive or semi-conductive layers or a non-conductive material coated with one or more conductive or semi-conductive layers. The non-conductive material can for instance be glass or an organic plastic such as PMMA or polycarbonate. The conductive layers may be a conducting oxide such as e.g. doped tin oxide or ITO. The semi-conducting layer(s) can be semi-conducting organic materials such as semi-conducting polymers. The conductive material can be a metal such as aluminium, gold or silver among others. In embodiments of the present invention, one or more intermediate layers may be applied between the substrate (e.g. a substrate having a conductive surface (e.g. a conductive layer)) and the crystalline nanofibre-containing active layer. The purpose of those layers can be to serve as hole injecting layers and/or hole transporting layers and/or electron blocking layers or to serve as electron-injecting layers and/or electron transporting layers and/or hole-blocking layers. Usable hole injecting layers (or hole transporting layer or electron blocking layer) are well known to the person skilled in the art and include for instance polyaniline ("PANI"), poly(3,4-ethylenedioxythiophene) ("PEDOT"), polypyrrole, organic charge transfer compounds (such as e.g. tetrathiafulvalene tetracyanoquinodimethane ("TTF-TCNQ")), as well as high work function metal oxides such as molybdenum oxide, vanadium oxide, and tungsten oxide, amongst others.

Usable electron injecting layers (or electron transport layer or hole-blocking layer) are well known to the person skilled in the art and include for instance a metal-chelated oxinoid compound (e.g., Alq3 or aluminum(III)bis(2-methyl-8-quinolinato)4-phenylphenolate ("BAlq")); a phenanthroline-based compound (e.g., 2,9-dimethyl-4,7-diphenyl-1,10-phenanthroline ("DDPA") or 9,10-diphenylanthracence ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl)biphenyl ("CBP"); 9,10-bis-[4-(2,2-diphenylvinyl)-phenyl]anthracene ("BDPVPA"); anthracene, N-arylbenzimidazoles (such as "TPBI"); 1,4-bis[2-(9-ethyl-3-carbazoyl)vinylenyl]benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene)vinylenyl]benzene; 4,4'-bis[2,2-(9,9-fluorenylene)vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl)iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV, as well as low work function metal oxides such as titanium oxide and zinc oxide, amongst others. The assembly of a substrate (e.g. substrate having a conductive layer such as ITO on glass) and of said one or more intermediate (conductive or semi-conductive) layers is to be understood as forming a substrate in the broadest sense. The substrate is preferably a transparent conductive substrate such as but not limited to glass coated with ITO. The substrates and/or the conductive or semi-conductive layers may be patterned. The substrate (e.g. a conductive substrate) can be flexible, rigid, planar, non-planar, transparent, opaque or translucent. It can be of any thickness. In embodiments, the solid substrate may deteriorate physically or chemically at the glass transition temperature of said nanofibre-forming polymer. It is indeed an advantage of the method according to embodiments of the first aspect of the present invention that, since no thermal annealing step is required, temperature sensitive substrate can be used without risking to deteriorated it during a thermal annealing step. For instance, flexible substrates and/or substrates with low heat stability can be used. In an embodiment, no annealing step is performed after step (d), i.e. neither thermal annealing step nor solvent annealing step. It has indeed be surprisingly observed that annealing does not improve substantially the properties of the layer obtained via the method of the first aspect of the present invention. Off course, an annealing step can nevertheless be used, e.g. a thermal annealing step, if the substrate is not sensible to the temperature used. After coating on a substrate, the layer produced by the method according to embodiments of the present invention can be used as an element of an organic electronic device. In the case of a photovoltaic device, the layer produced can serve as a hole transporting layer or, if an electron accepting guest has been integrated in the layer, as a photovoltaic layer, i.e. a layer wherein excitons are generated upon illumination.

Preferably, after step (c) and before step (d), a step (c') of maintaining said dispersion at said temperature $T_3$ for a period long enough to achieve a stable crystalline nanofibre content in said dispersion is performed. This period may be 30 minutes or more, preferably 45 minutes or more, most preferably 1 hour or more. The crystalline nanofibre content of the dispersion is considered stable when it does not vary significantly in time anymore. The achievement of a stable crystalline nanofibre content can be checked directly by monitoring the crystalline nanofibre-content of the dispersion or indirectly by monitoring the content of the nanofibre-forming polymer dissolved in the dispersion media. Any detection means known to the person skilled in the art for detecting solid particles in a liquid media or for characterising dissolved polymer can be used for this purpose. For instance, UV-vis spectroscopy or GPC can be used.

Preferably, at least step (a) is performed in the dark and/or under inert atmosphere. This is advantageous as nanofibre-forming polymers are usually relatively sensitive to light and to oxidation. This sensitivity is greater at higher temperatures. Optionally, all steps (a) to (d) may be performed in the dark and/or under inert atmosphere. By inert atmosphere is meant an atmosphere made of an unreactive gas such as but not limited to argon or nitrogen.

Preferably, step (d) is performed on a conductive surface of said solid substrate.

In an embodiment, the method of the present invention may further comprise dissolving an amorphous polymer in the solution or dispersion before step (d). The amorphous polymer may be as defined above. The amorphous polymer may be chosen so as to modify the viscosity of the solution and/or to improve the printability and/or to improve the adhesion of the coating obtained during step (d). Similarly, additives may be added to the solution or dispersion before step (d). For instance adhesion promoters or additives aimed at enhancing the printability or at modifying the viscosity of the solution or dispersion may be added.

In a second aspect, the present invention relates to an organic electronic device comprising a polymer layer obtainable by any of the embodiments of the first aspect of the present invention. Organic electronic devices in which the active layer according to embodiments of the present invention can be used are preferably opto-electronic devices (e.g. solar cells, organic light-emitting diodes (OLEDs), photodetectors, phototransistors, opto-couplers, or lasers) or devices such as organic field effect transistors (OFETs) or memory elements among others. For instance, the methods according to embodiments of the present invention allow the possibility to optimize the power efficiency of an organic photovoltaic device by means of a systematic study using for all devices the same polymer dispersion but processed as active layer at a different temperature in order to optimize the nano-morphology and therefore the power efficiency of the solar cells.

It is an aspect of the present invention to provide methods to optimize the crystalline nanofibre content of a polymer dispersion comprising crystalline nanofibres of a given polymer and a soluble fraction of the same polymer.

It is another aspect of the present invention to provide methods for optimizing the crystalline nanofibre content of a polymer composition comprising a polymer dispersion as described above and one or more electron acceptor materials. The composition can be used as an active layer in an organic electronic device. The crystalline nanofibre content of the polymer composition used to form the active layer influences the morphology of this active layer and by consequence the efficiency of the device comprising this active layer (e.g. the power efficiency of a solar cell)

Another aspect of the present invention relates to a deposition method involving the coating of a polymer dispersion or composition as defined above on a substrate.

EXAMPLE 1

Preparation of a Mother Polymer Dispersion Based on P36T 5 mg of regioregular poly(3-hexylthiophene) having a Mn of 23700 g/mol and a Mw of 42700 g/mol [determined relative to poystyrene standards in chlorobenzene at 60° C.] were dissolved in 10 g of heated cyclohexanone at 150° C. under agitation until total dissolution of the polymer (clear orange solution).

This dissolution corresponds to the step (a) of forming a solution by dissolving a nanofibre-forming polymer in a solvent at a temperature $T_1$ high enough to enable the formation of said solution.

During the process of dissolution, the solution was protected from light and air, to avoid chemical oxidation and/or photo-oxidation. After the total dissolution of the nanofibre-forming polymer, the solution was slowly cooled to 50° C. The speed of cooling was approximately 20° C./hour. At 50° C. the solution was filtered through a porous membrane (typically a teflon® filter membrane with a 0.45 μm porosity) to remove the precipitate which started to be formed at 70° C. This filtering step is optional and fulfils the purpose of removing non fibre-like aggregates. The process of crystalline nanofibre formation was continued by cooling the filtrate again at 20° C./hour to ambient temperature whereupon an opaque solution was obtained with a violet colour.

Remark: The content of crystalline nanofibres in the mother polymer dispersion is intrinsically linked to the polymer molecular weight distribution, the concentration of polymer in the solvent and the type of solvent.

EXAMPLE 2

Figure 4:
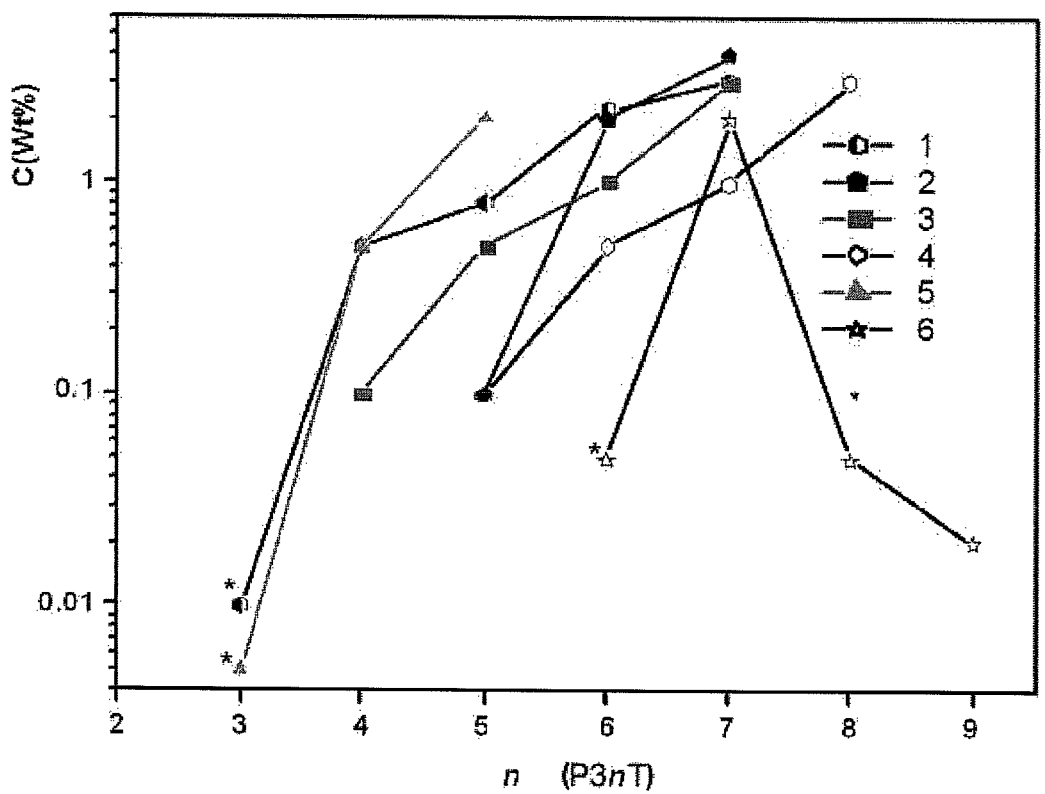
FIG. 4 is a graph summarising mother polymer dispersions that have been fabricated in step (b) of embodiments of the method according to the present invention.

Preparation of Polymer Dispersions Based on Regioregular P3mT with Adjustable Nano-Fiber Contents According to an Embodiment of the Present Invention Mother Polymer dispersions were made according to example 1 but choosing from 25 solvents and 7 polymers of the general formula (I):

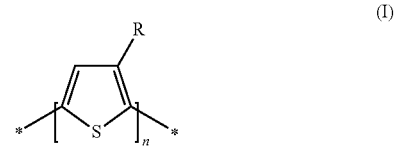

wherein R is a linear alkyl chain having from 3 to 9 carbon atoms. The 61 combinations solvent/polymer (see table below wherein m indicates the number of carbon atoms in the R group) were tested for various concentrations of polymer (I) (from 0.001 wt % to 5 wt %, see FIG. 4) and dispersions comprising crystalline nanofibres of the nanofibre-forming polymer (I) were obtained without aggregates upon cooling as described for example 1. In FIG. 4, curves 1 to 6 relates respectively to the use of the following solvents: tetralin, 1,2,4-trimethylbenzene, p-xylene, decaline, chorobenzene and cyclohexanone; the integer n (X-axis) indicates the number of carbons in the R chain; the Y-axis indicates the concentration in nanofibre-forming polymer used to make the mother polymer solution.

| Solvent | m |
|---|---|
| 1-Methylnaphthalene | 3 |
| p-Xylene | 3, 4, 5, 6, 7 |
| o-Xylene | 5 |
| Tetralin | 3, 4, 5, 6, 7 |
| 1,2,4-Trimethylbenzene | 4, 5, 6, 7 |
| (1S)-(−)-a-Pinene | 8, 9 |
| Cyclohexanone | 7, 8, 9 |
| Octane | 7 |
| Dodecane | 9 |
| Methylcyclohexane | 8, 9 |
| Pinane | 7, 8, 9 |
| Decalin | 4, 5, 6, 7, 8, 9 |
| Bromobenzene | 4 |
| Chlorobenzene | 3, 4, 5, 6, 7 |
| o-Chlorotoluene | 4 |
| 1,2-Dichlorobenzene | 4 |
| 1,3-Dichlorobenzene | 3, 4 |
| 1,4-Dichlorobenzene | 3 |
| 1,2,4-Trichlorobenzene | 3, 4, 5 |
| Tetrachloroethylene | 3 |
| Tetrachlorothiophene | 3 |
| $CS_2$ | 3 |
| Anisole | 4, 5, 6, 7, 9 |
| Benzyl ether | 4, 7, 9 |
| Acetophenone | 7, 9 |

A follow-up by UVNis (see specific examples in FIG. 1-3) or GPC was done in the course of the fiber formation to determine when the thermodynamic equilibrium was obtained (i.e. amount of crystalline nanofibre content in the polymer dispersion remains stable over time).

In FIG. 1, the crystalline nanofibre formation in a mother polymer dispersion of P34T (0.5% wt) [the first number represents the substitution position and the second number represents the number of carbon atoms in the alkyl group] in chlorobenzene was monitored using absorption spectroscopy. Absorption spectrum were recorded after 1 (curve 1), 2 (curve 2), 3 (curve 3) and 10 days (curve 10) at room temperature. Curve ref shows the spectrum of the corresponding polymer solution. The arrow indicates the place on the spectrum where aggregates, if any, would have been expected to appear. In this specific example, at least 4 days were necessary to obtain thermodynamic equilibrium and the yield of nanofibre formation was relatively high.

Figure 2:
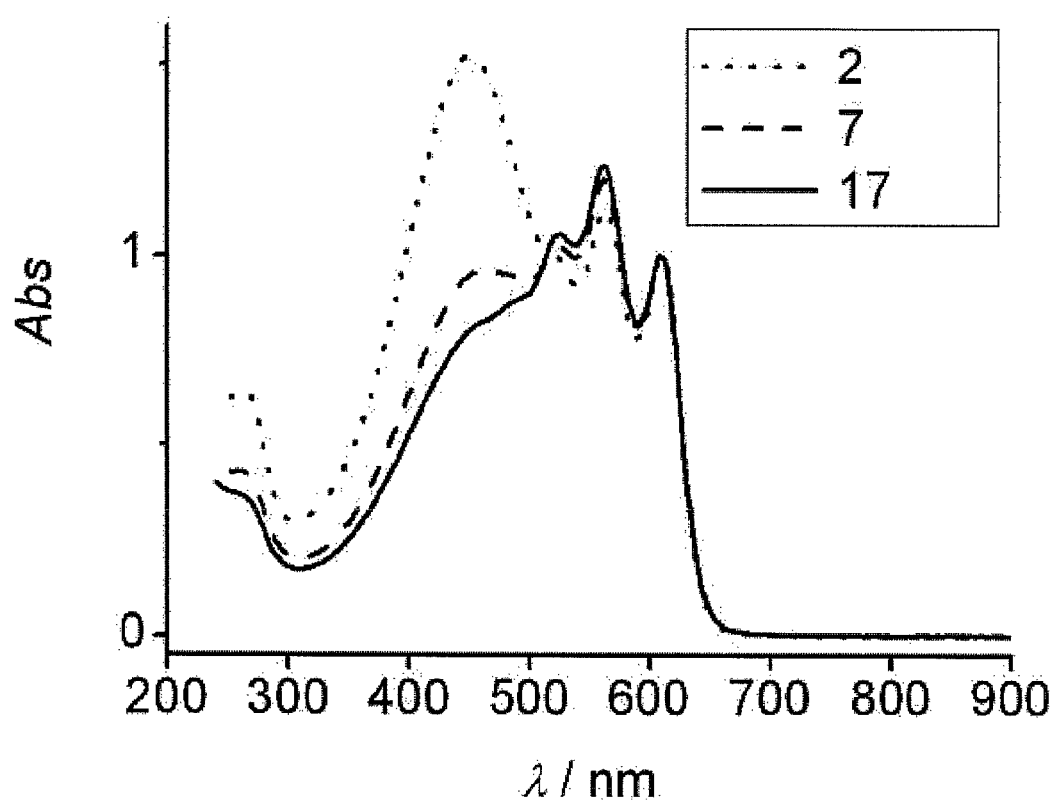
FIG. 2 is a graph showing curves, taken at different times, of the normalized absorbance versus the wavelength (nm) for a polymer dispersion of P39T (0.8% wt) in pinane obtained in step (b) of embodiments of the method according to the present invention.

In FIG. 2, the crystalline nanofibre formation in a mother polymer dispersion of P39T (0.8% wt) in pinane was monitored using absorption spectroscopy. Absorption spectrum were recorded after 2 (curve 2), 7 (curve 7), and 17 days (curve 17) at room temperature. In this specific example, at least 8 days were necessary to obtain thermodynamic equilibrium and the yield of nanofibre formation was relatively high.

Figure 3:
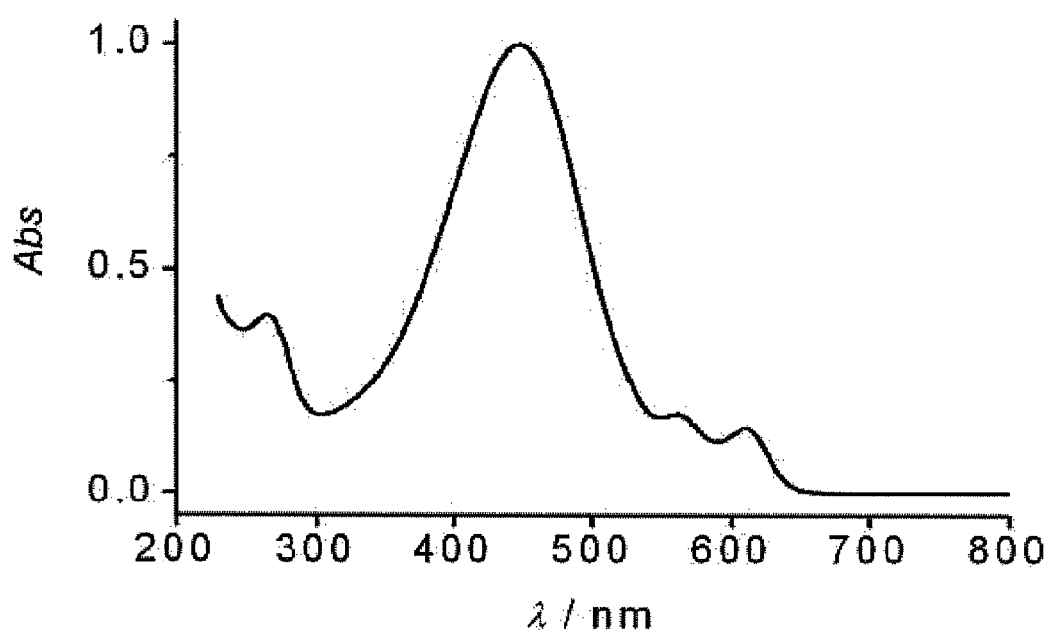
FIG. 3 is a graph of the normalized absorbance versus the wavelength (nm) for a polymer dispersion of P38T (3% wt) in decaline obtained in step (b) of embodiments of the method according to the present invention.

In FIG. 3, the crystalline nanofibre formation in a mother polymer dispersion of P38T (3% wt) in decalin was monitored using absorption spectroscopy. An absorption spectrum was recorded after 2 days at room temperature. In this specific example, the yield of nanofibre formation was relatively low.

Figure 5:
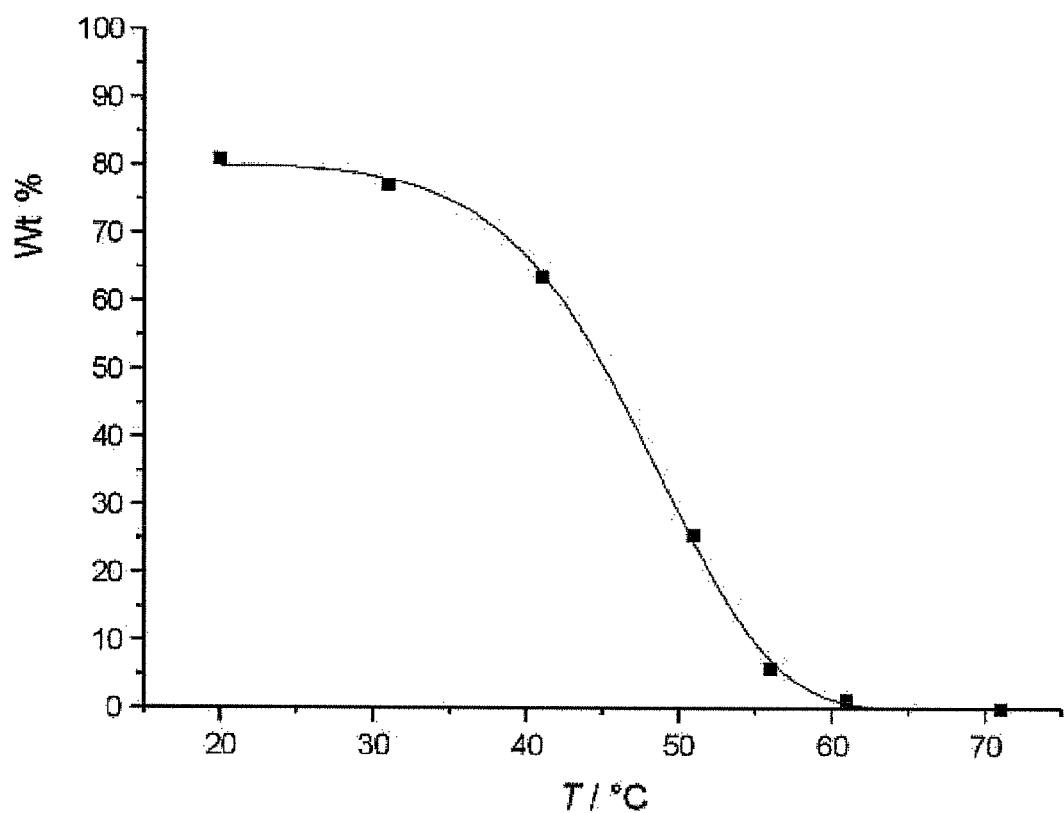
FIG. 5 is a graph of the crystalline nanofibre content (%) versus the temperature $T_3$ for the nanofibre-forming polymer P36T (0.5 wt % dispersion in p-xylene) obtained in step (c) of embodiments of the method of the present invention.

Novel polymer dispersions with adjustable crystalline nanofibre contents were then obtained by means of a temperature control, i.e. by raising the temperature above room temperature to a specific temperature. FIG. 5 shows the variation of the crystalline nanofibre content in one specific example of polymer/solvent based on P36T 0,5 wt % in p-xylene in function of the temperature. The obtained polymer dispersions differ in function of the temperature. Each of these polymer dispersions can then be used as an active layer in an organic electronic device.

EXAMPLE 3

Preparation of a Polymer Composition with Different Nano-Fiber Contents in Active Layers (General Procedure)

Polymer compositions were made by adding PCBM to the wanted mother polymer dispersion obtained in accordance with example 2, in this example P3alkylT:PCBM in a predefined weight ratio. These polymer compositions were stirred with a magnetic stirrer for 2 days at room temperature. Then the polymer composition was put in a heating block under continuously stirring and heated until a temperature $T_3$ above 20° C. was reached. The solution was left for at least one hour at this temperature $T_3$ (to obtain a new fibre content equilibrium). A very small amount of the polymer composition at the temperature $T_3$ (about 45 μl) was taken and diluted in about 3 ml of solvent in order to determine the exact crystalline nanofibre content of the polymer composition by UV-Vis or by GPC.

Then about 300 μl to 400 μl of the solution was spin-coated to make an active layer from the polymer composition at $T_3$ having a defined crystalline nanofibre content. The spin-coating speed was around 500-1000 rpm.

Then the temperature of the polymer composition was slightly increased to a temperature $T_3'$, wherein $T_3'>T_3$, and the composition was allowed to rest for at least half an hour to obtain a new fiber content equilibrium. A very small amount of the polymer composition at the temperature $T_3'$ (about 45 μl) was taken and diluted in about 3 ml of solvent in order to determine the exact crystalline nanofibre content of the polymer composition by UV-Vis or by GPC.

About 300 μl to 400 μl of the composition was spin-coated to make an active layer from the polymer composition at $T_3'$ having a defined crystalline nanofibre content. The spin-coating speed was around 500-1000 rpm.

This was repeated for further temperatures $T_3''$, $T_3'''$, $T_3''''$, etc, where $T_3''''>T_3'''>T_3''>T_3'$ are all temperatures lower that the boiling point temperature of the polymer composition solvent.

EXAMPLE 4

Preparation of Polymer/PCBM Compositions with Different Nano-Fiber Contents

Figure 6:
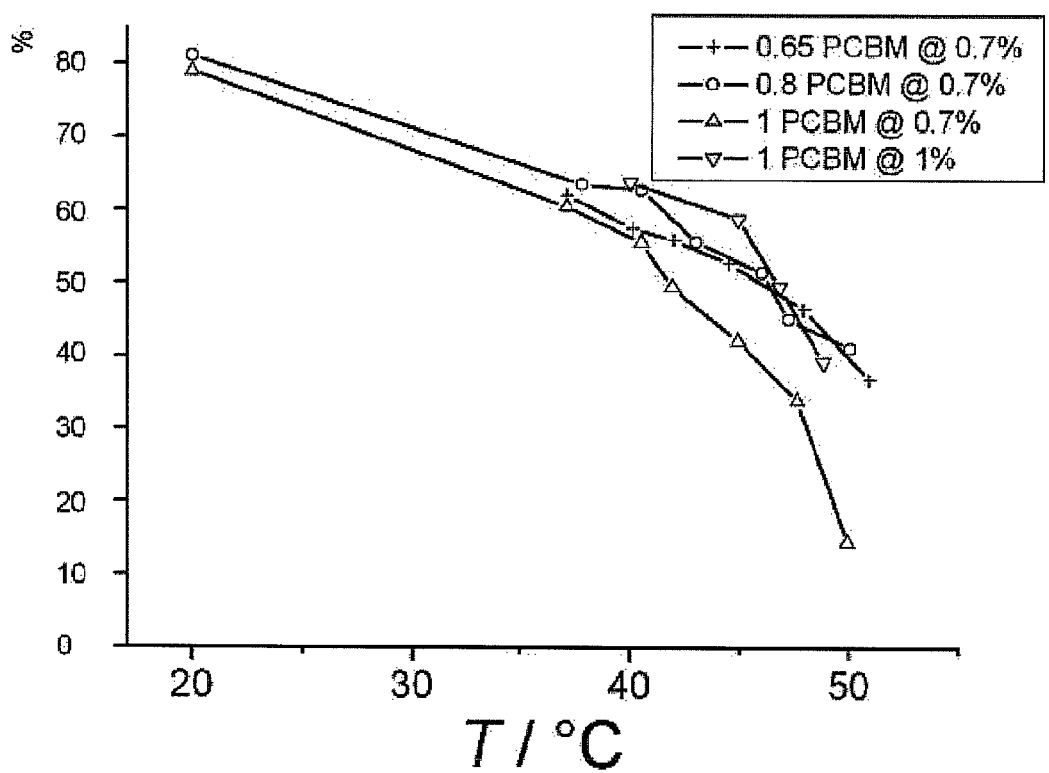
FIG. 6 is a graph showing curves of the crystalline nanofibre content (wt %) in the nanofibre-forming polymer P36T, in presence of PCBM, versus temperature $T_3$ according to embodiments of the present invention.

Polymer/PCBM compositions in p-xylene were prepared with a P36T polymer concentration of 0.7% with PCBM concentrations of 0.65%, 0.8%, and 1% respectively giving polymer/PCBM ratios of 1.07, 0.87 and 0.7 respectively and the nanofibre content investigated as a function of temperature, see FIG. 6. The nanofibre content was also investigated as a function of temperature for a polymer/PCBM composition in p-xylene with P36T- and PCBM-concentrations each being 1.0% giving a P36T/PCBM ratio of 1.0, see FIG. 6.

The nanofibre-forming polymer of the polymer compositions had a crystalline nanofibre content of around 80% at room temperature. The crystalline nanofibre content in the polymer composition was adjusted by means of an accurate control of the temperature of the polymer composition as shown in the FIG. 6. The crystalline nanofibre content of a given polymer dispersion could be varied so that it forms between 10% and 80% by weight of the nanofibre-forming polymer.

Other examples of polymer compositions based on other polymers, concentrations and solvents are shown in FIG. 7-11.

Figure 7:
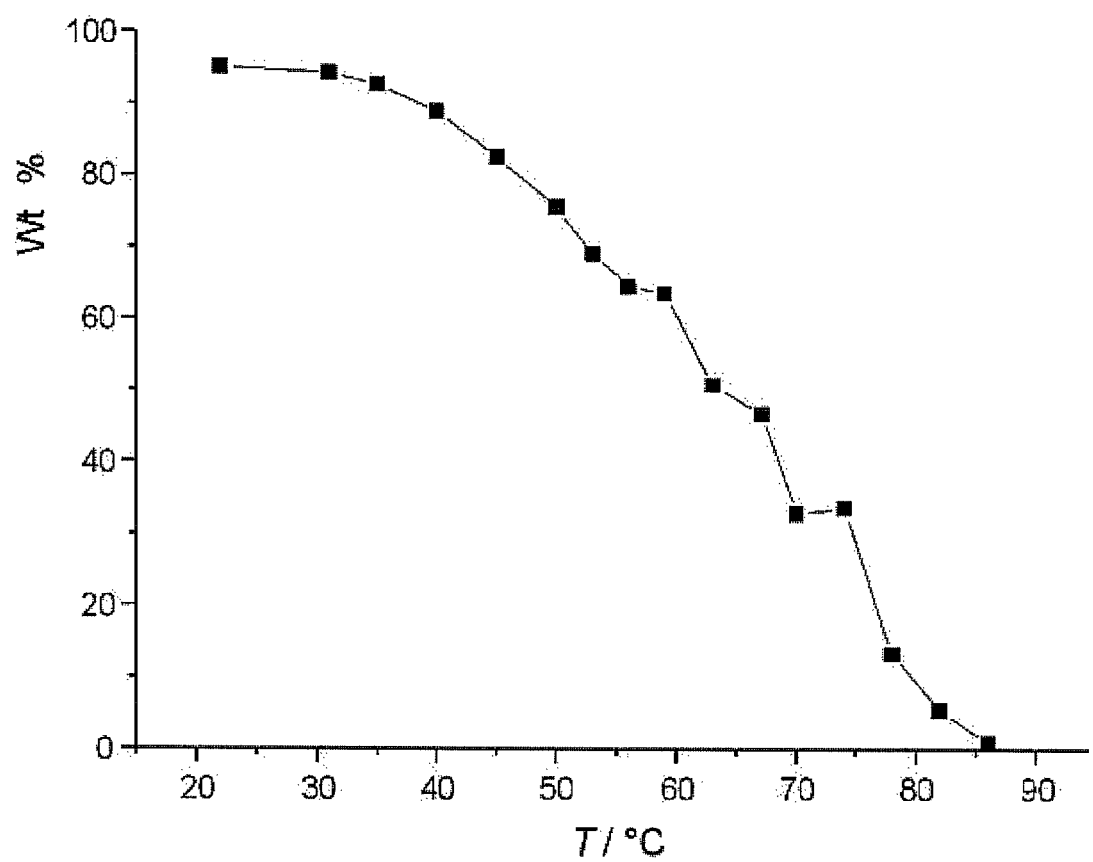
FIG. 7 is a graph of the crystalline nanofibre content (wt %) versus the temperature $T_3$ for the nanofibre-forming polymer P34T (0.4 wt % dispersion in o-chlorotoluene, in the presence of 0.4 wt % of PCBM) obtained in step (c) of embodiments of the method of the present invention.

In FIG. 7, the nanofibre-forming polymer P34T (0.4 wt % dispersion in o-chlorotoluene, in the presence of 0.4 wt % of PCBM) was used.

Figure 8:
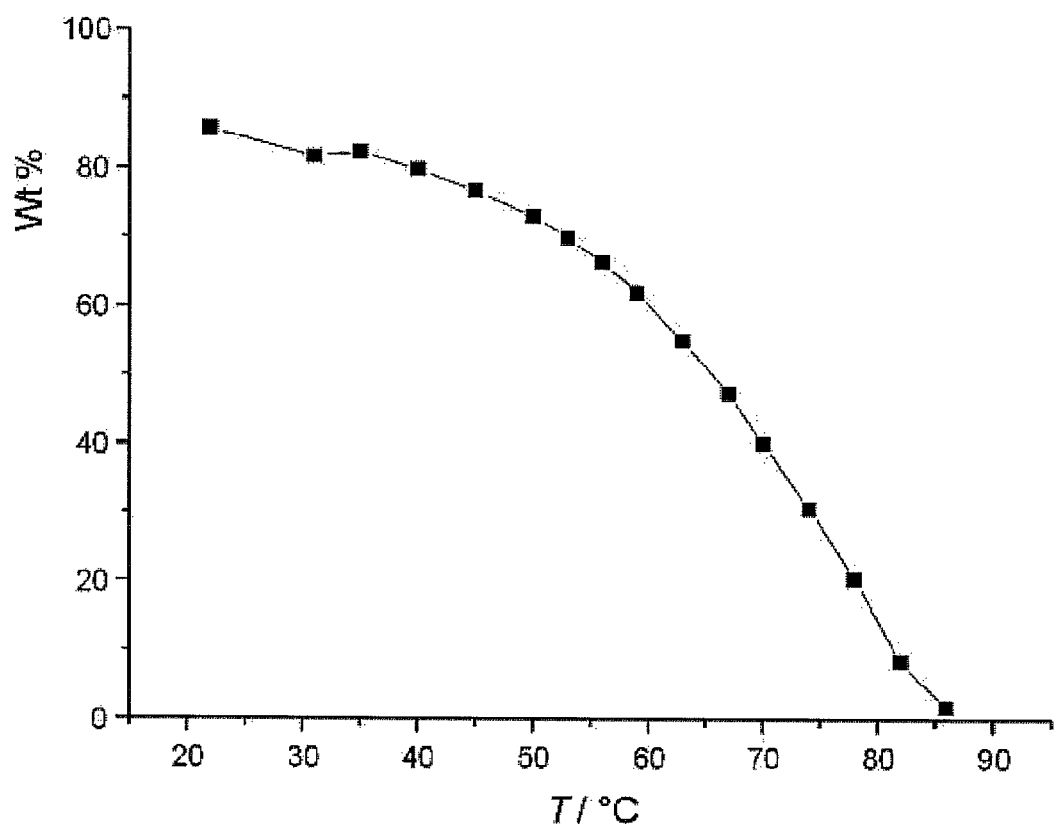
FIG. 8 is a graph of the crystalline nanofibre content (wt %) versus the temperature $T_3$ for the nanofibre-forming polymer P35T (0.6 wt % dispersion in p-xylene, in the presence of 0.6 wt % of PCBM) obtained in step (c) of embodiments of the method of the present invention.

In FIG. 8, the nanofibre-forming polymer P35T (0.6 wt % dispersion in p-xylene, in the presence of 0.6 wt % of PCBM) was used.

Figure 9:
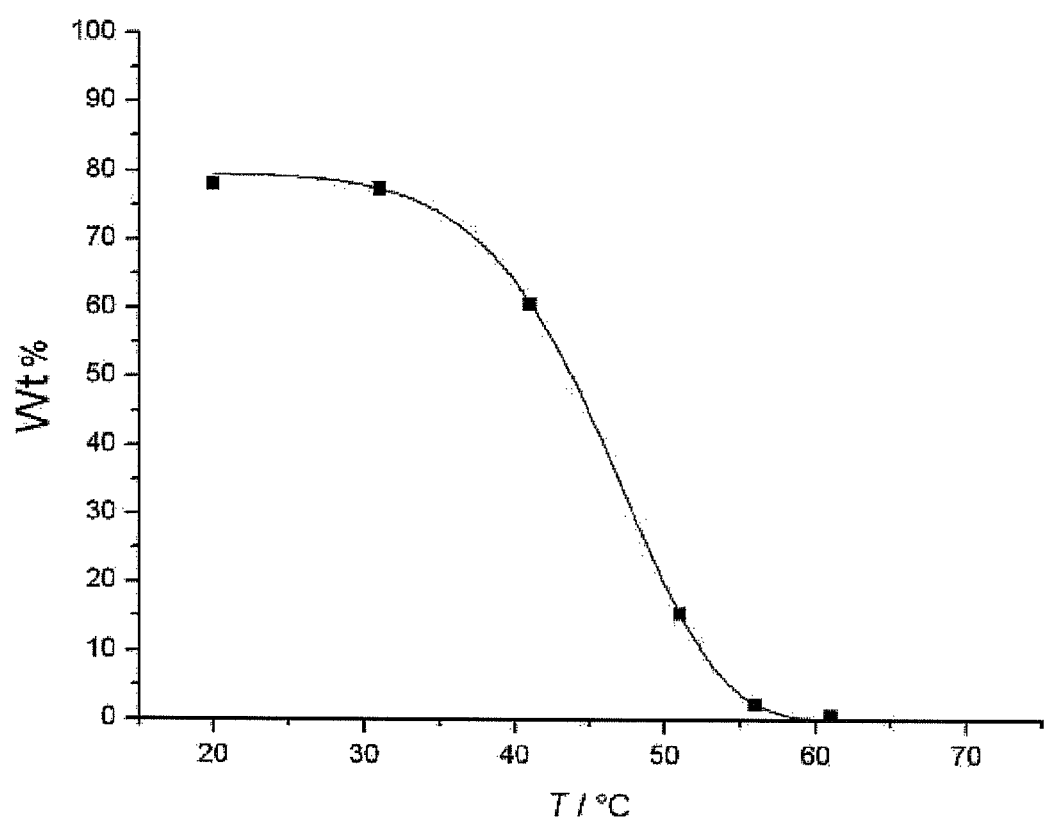
FIG. 9 is a graph of the crystalline nanofibre content (wt %) versus the temperature $T_3$ for the nanofibre-forming polymer P36T (0.5 wt % dispersion in o-chlorotoluene, in the presence of 0.5 wt % of PCBM) obtained in step (c) of embodiments of the method of the present invention.

In FIG. 9, the nanofibre-forming polymer P36T (0.5 wt % dispersion in p-xylene, in the presence of 0.5 wt % of PCBM) was used.

Figure 10:
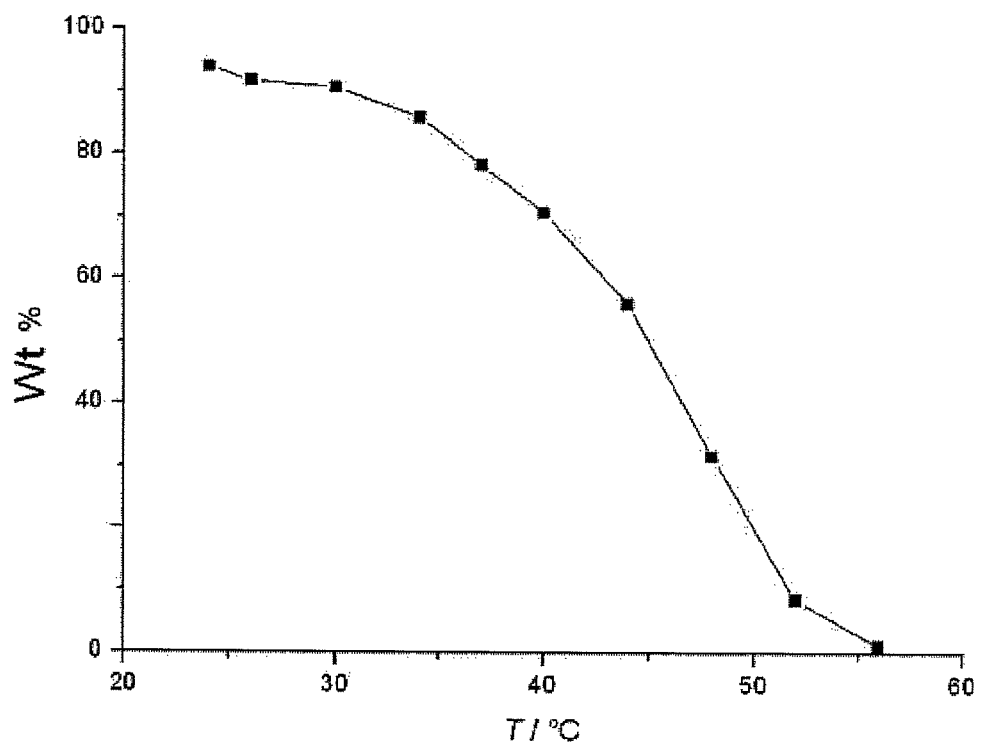
FIG. 10 is a graph of the crystalline nanofibre content (wt %) versus the temperature $T_3$ for the nanofibre-forming polymer P38T (0.5 wt % dispersion in pinane, in the presence of 0.5 wt % of PCBM) obtained in step (c) of embodiments of the method of the present invention.

In FIG. 10, the nanofibre-forming polymer P38T (0.5 wt % dispersion in pinane, in the presence of 0.5 wt % of PCBM) was used.

Figure 11:
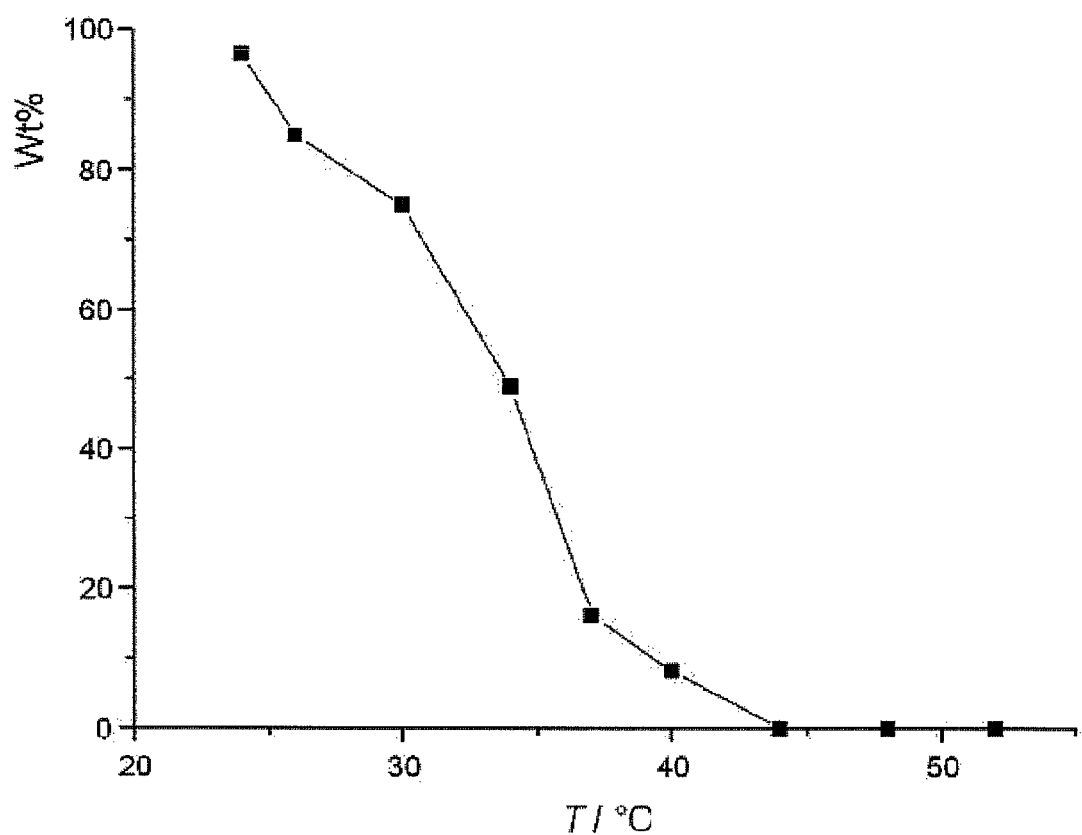
FIG. 11 is a graph of the crystalline nanofibre content (wt %) versus the temperature $T_3$ for the nanofibre-forming polymer P39T (0.5 wt % dispersion in pinane, in the presence of 0.5 wt % of PCBM) obtained in step (c) of embodiments of the method of the present invention.

In FIG. 11, the nanofibre-forming polymer P39T (0.5 wt % dispersion in pinane, in the presence of 0.5 wt % of PCBM) was used.

Novel polymer compositions having a content of nano-fibers comprised between 0 and 95% could be obtained in accordance with embodiments of the present invention.

EXAMPLE 5

Figure 12:
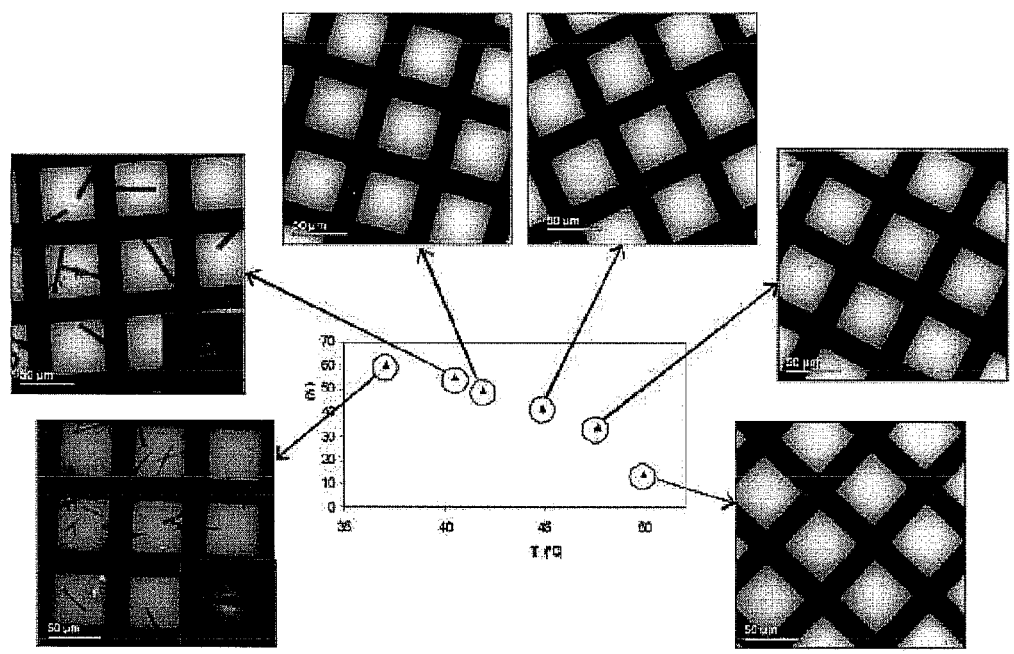
FIG. 12 shows a graph of the crystalline nanofibre content (wt %) versus the temperature $T_3$ for the nanofibre-forming polymer P36T (in the presence of PCBM) obtained in step (c) of embodiments of the method of the present invention. It also shows pictures of films processed according to step (d) at different temperature $T_3$.
Figure 13:
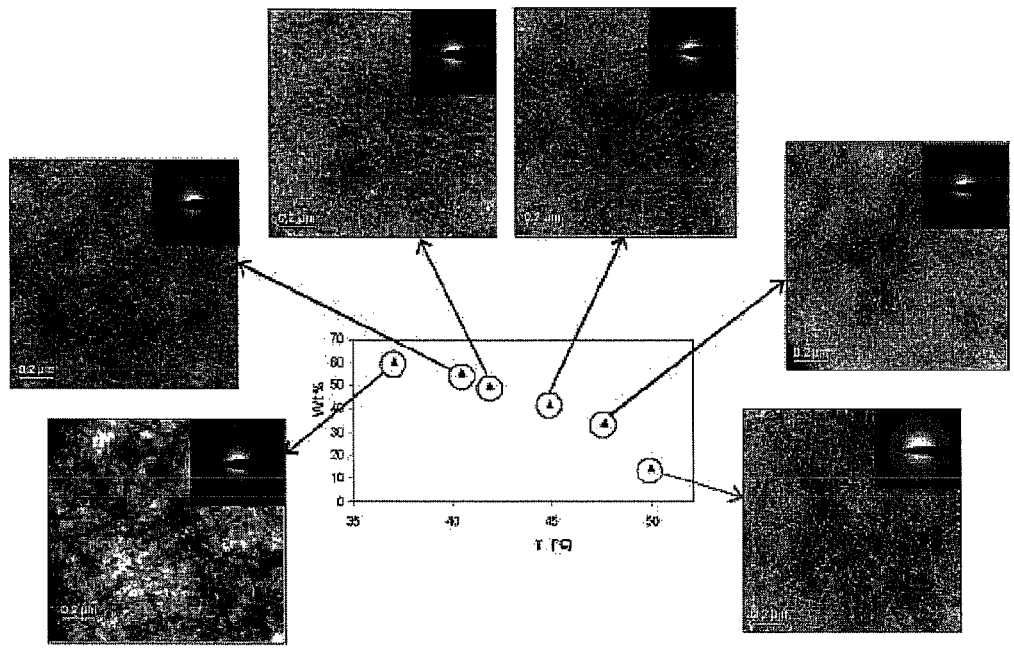
FIG. 13 is the same graph as in FIG. 12. The pictures are magnified 250 times in comparison with FIG. 12.

Adjusting the Nano-Morphology of Thin Films Processed from Various Polymer Compositions by Varying the Temperature of the Film Deposition Process The temperature of the polymer compositions when coated as a thin film determines the nano-morphology of the film as shown in the FIG. 12 and FIG. 13. In this example, an optimum nano-morphology was obtained at a temperature of 45° C. corresponding to a fiber content of 42% for the polymer composition (in that example ratio of P36T/PCBM was equal to 1/1).

EXAMPLE 6

Organic Solar Cells Made from Polymer Compositions

Using an accurate control of the temperature during the processing, various polymer compositions having different contents of nano-fibers can be easily obtained. A series of organic solar cells were fabricated using the polymer compositions described in example 4. The cells were prepared on glass/ITO substrates. The substrates were cleaned in an ultrasonic bath with water and acetone. Then they were exposed to UV-ozone for 30 minutes. PEDOT:PSS was deposited by spin coating and dried for 15 minutes at 150° C. Each polymer composition was deposited on different substrates by spin coating without any filtration under inert atmosphere (glove box). To finish, a CaAl electrode was deposited by evaporation on each active layer obtained from the various polymer compositions. The active surface was 0.28 cm$^2$.

Figure 14:
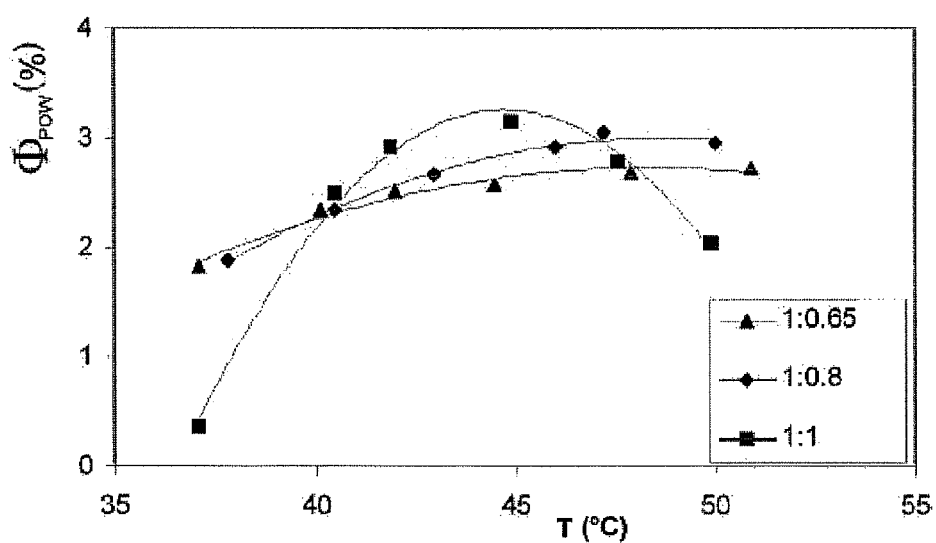
FIG. 14 is a graph showing curves of the power efficiency (%) versus the temperature $T_3$ (° C.) of solar cells comprising a layer obtained in step (d) of an embodiment of the method according to the present invention for three different ratios P36T:PCBM.

For each solar cell, the polymer composition was processed towards the active layer at a specific temperature (i.e. various nano-fiber contents and different nano-morphologies). In the case shown on FIG. 14 where P36T:PCBM=1:1, an optimal power efficiency was found for a polymer dispersion coated at 45° C. At this point the nano-fiber content is 42% as accurately determined by UV-Vis or GPC (see example 4). FIG. 14 also shows curves measured for P36T:PCBM ratios of 1:0.65 and 1:0.8.

Figure 18:
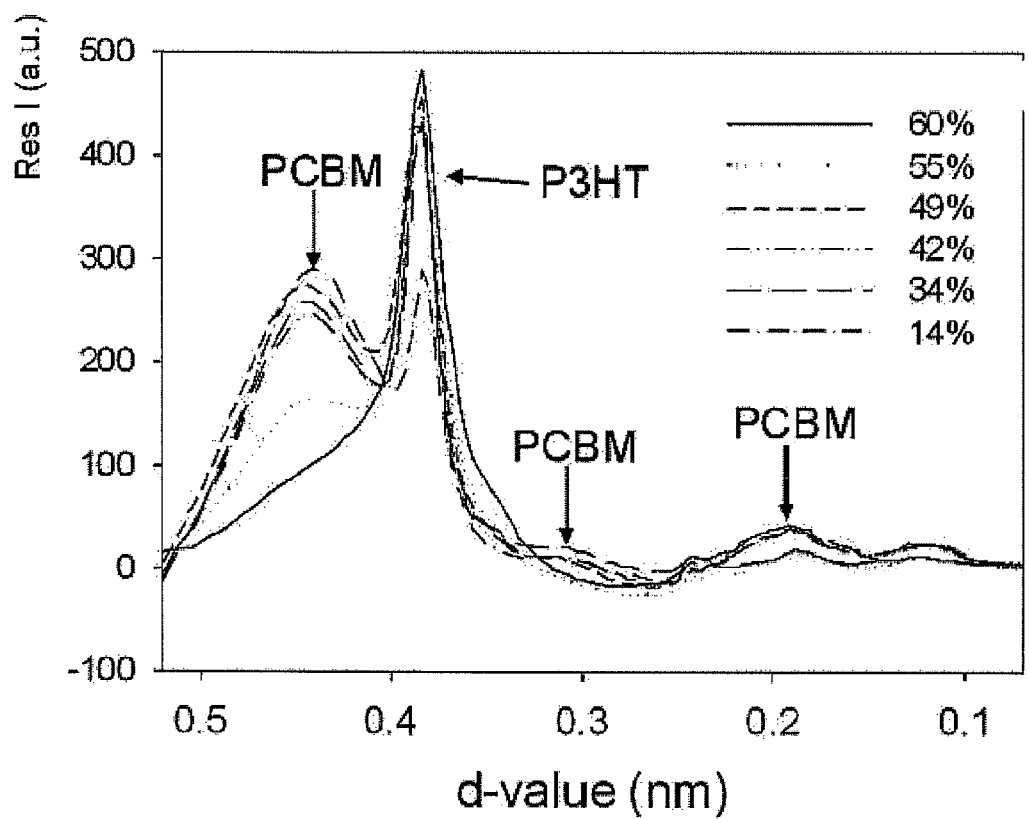
FIG. 18 is a graph of the residual intensities of SAED patterns versus the d-value (nm) for films obtained according to embodiments of the present invention.
Figure 19:
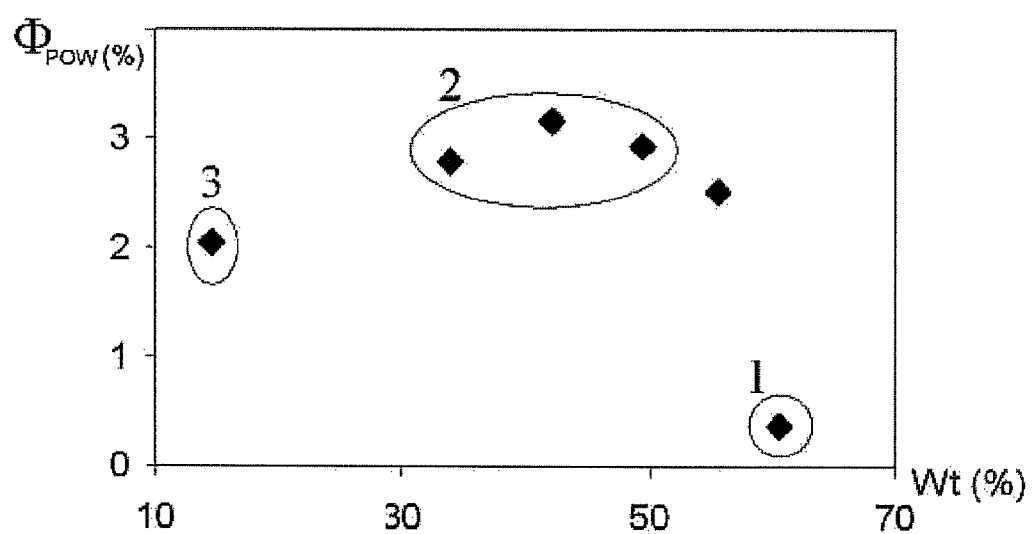
FIG. 19 is a graph of the power efficiency (%) versus the crystalline nanofibre content (%) in P36T/PCBM films obtained according to embodiments of the present invention.

At 45° C. for P36T:PCBM=1:1, the nano-fiber content in the polymer composition is optimal in order to have a good blend of the polymer dispersion and the PCBM needles as shown in FIGS. 18 and 19: lower crystalline nanofibre content did not improve the results, and higher crystalline nanofibre content tended to induce PCBM clusters. In FIG. 18, the percentage indicated relates to the crystalline nanofibre content in the nanofibre-forming polymer.

Figure 15:
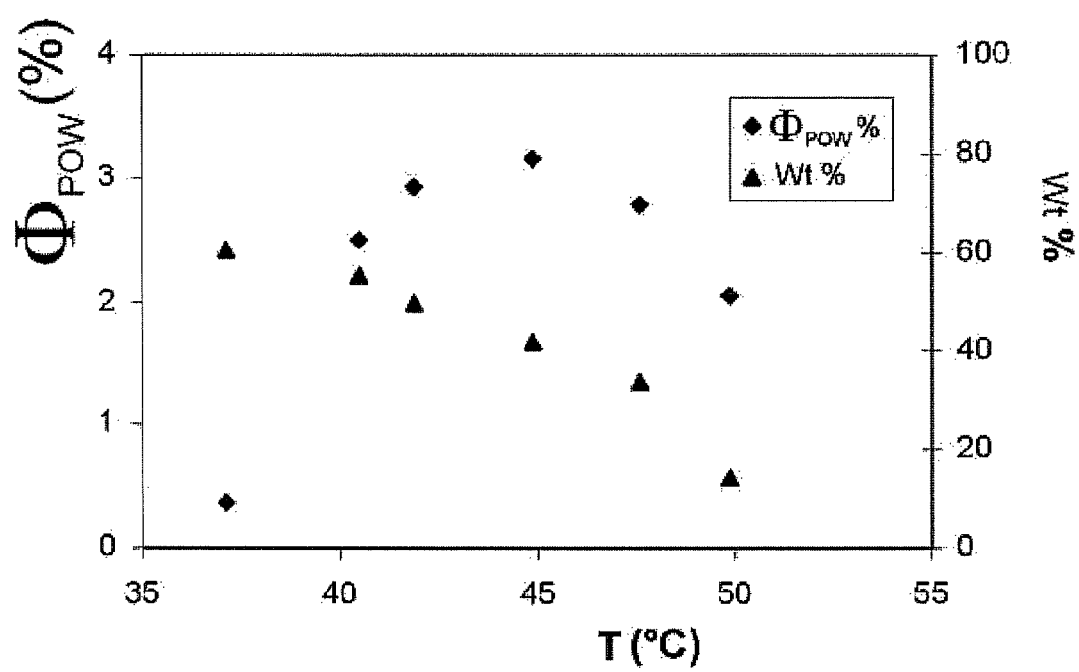
FIG. 15 is a graph showing on one hand the power efficiency (%) versus the temperature $T_3$ and on another hand the crystalline nanofibre content (wt %) versus the temperature $T_3$ of solar cells comprising a layer obtained in step (d) of an embodiment of the method according to the present invention for the nanofibre-forming polymer P36T (0.7% dispersion in p-xylene, in the presence of 0.7% wt PCBM).
Figure 16:
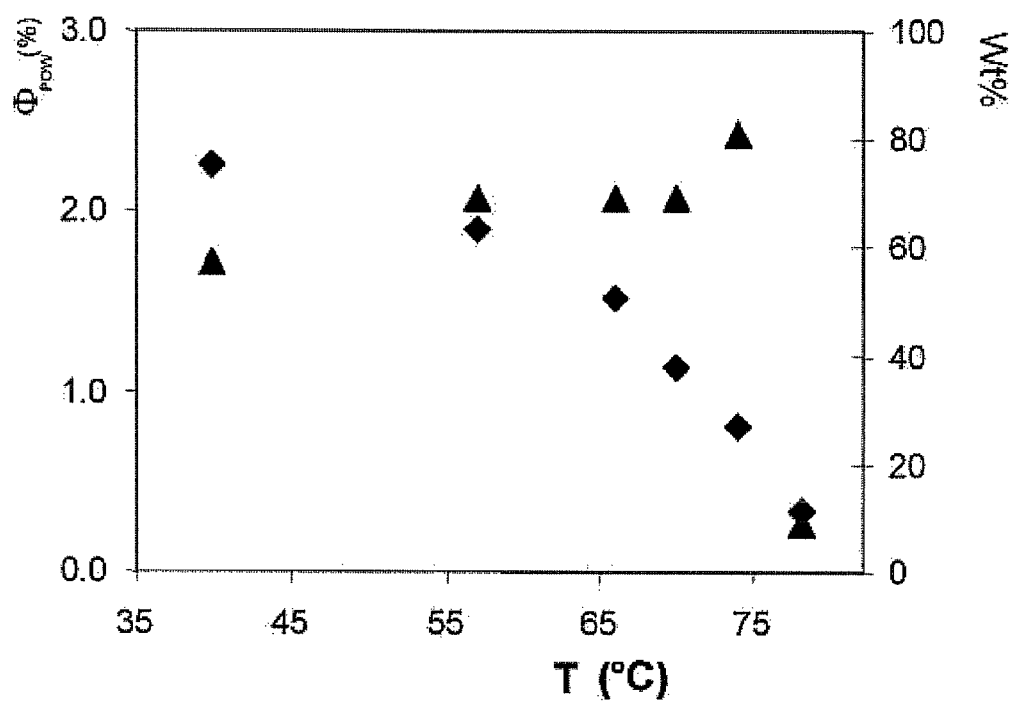
FIG. 16 is a graph showing on one hand the power efficiency (%) versus the temperature $T_3$ and on another hand the crystalline nanofibre content (wt %) versus the temperature $T_3$ of solar cells comprising a layer obtained in step (d) of an embodiment of the method according to the present invention for the nanofibre-forming polymer P35T (0.6% dispersion in p-xylene, in the presence of 0.6% wt PCBM).
Figure 17:
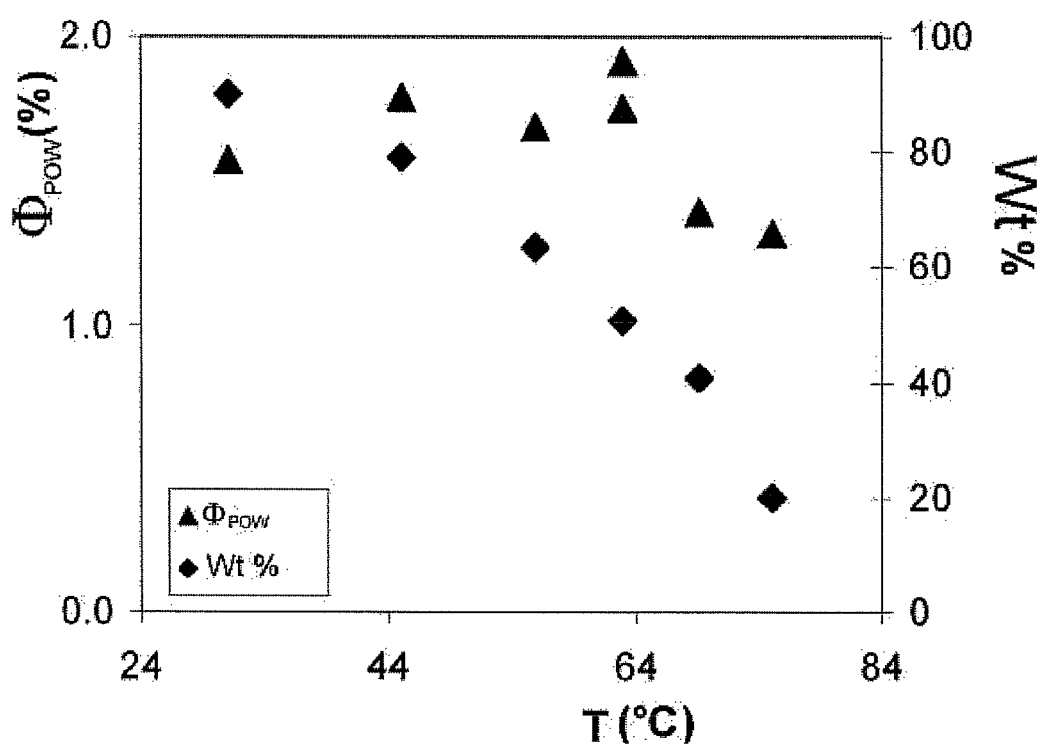
FIG. 17 is a graph showing on one hand the power efficiency (%) versus the temperature $T_3$ and on another hand the crystalline nanofibre content (wt %) versus the temperature $T_3$ of solar cells comprising a layer obtained in step (d) of an embodiment of the method according to the present invention for the nanofibre-forming polymer P34T (0.4% dispersion in o-Chlorotoluene, in the presence of 0.4% wt PCBM).

In FIG. 15, the power efficiency (diamonds) and the nanofibre content (triangles) (in the nanofibre-forming polymer) of further devices is plotted against deposition temperature. In FIG. 15, a P36T:PCBM 1:1 mixture was used dispersed in p-xylene. The concentration of P36T was 0.7%. The maximum power efficiency (~3.2%) was obtained for a deposition temperature of ~45° C. which correspond to a nanofibre content of 41% wt. In FIG. 16, the power efficiency (triangles) and the nanofibre content (diamonds) (in the nanofibre-forming polymer) of further devices is plotted against deposition temperature. In FIG. 16, a P35T:PCBM 1:1 mixture was used dispersed in p-xylene. The concentration of P35T was 0.6%. The maximum power efficiency (~2.4%) was obtained for a deposition temperature of ~74° C. which correspond to a nanofibre content of 27% wt. In FIG. 17, the power efficiency (triangles) and the nanofibre content (diamonds) (in the nanofibre-forming polymer) of further devices is plotted against the deposition temperature. In FIG. 17, a P34T:PCBM 1:1 mixture was used dispersed in o-chlorotoluene. The concentration in P34T was 0.4%. The maximum power efficiency (~1.9%) was obtained for a deposition temperature of ~63° C. which corresponded to a nanofibre content of ~50% wt.

Figure 20:
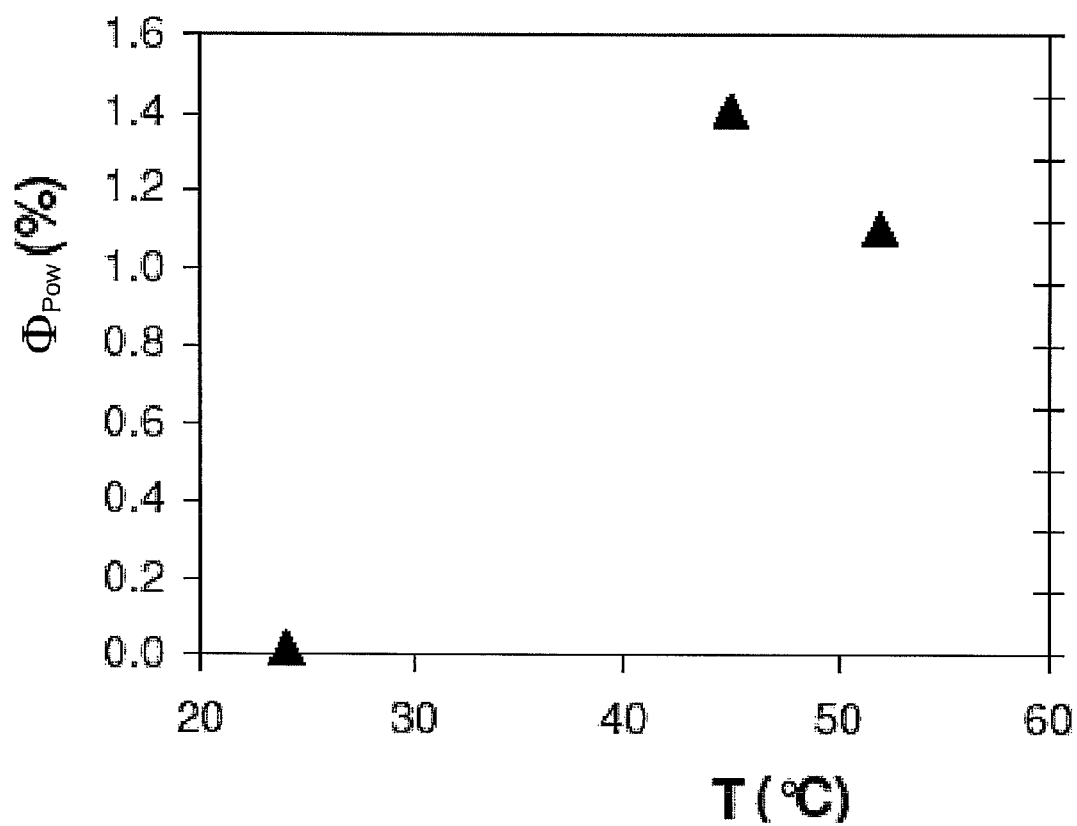
FIG. 20 is a graph showing the power efficiency (%) versus the temperature $T_3$ for layers of P37T (0.5 wt %) dispersed in pinane in the presence of PCBM (0.5 wt %). PCBM was added from a 4% solution in 1,2,4-trimethylbenzene.

In FIG. 20, the power efficiency of further devices is plotted against the deposition temperature. In FIG. 20, a P37T:PCBM 1:1 mixture is used dispersed in pinane. The concentration in P37T was 0.5%. The PCBM was added from a solution in 1,2,4-trimethylbenzene (4%). The maximum power efficiency (~1.4%) was obtained for a deposition temperature of ~46° C.

Figure 21:
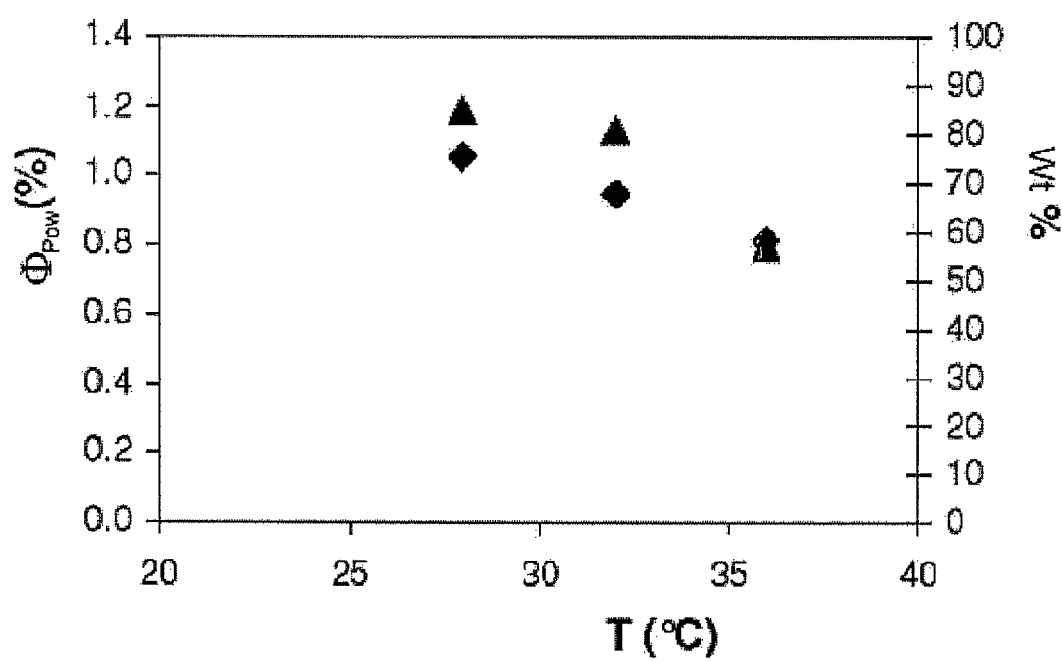
FIG. 21 is a graph showing the power efficiency (%) (triangles) versus the temperature $T_3$ for layers of P38T (0.7 wt %) dispersed in pinane in the presence of PCBM (0.7 wt %). PCBM was added from a 4% solution in 1,2,4-trimethylbenzene.

In FIG. 21, the power efficiency (triangles) and the nanofibre content (diamonds) (in the nanofibre-forming polymer) of further devices is plotted against the deposition temperature. In FIG. 21, a P38T:PCBM 1:1 mixture is used dispersed in pinane. The concentration in P38T was 0.7%. The PCBM was added from a solution in 1,2,4-trimethylbenzene (4%). The maximum power efficiency (~1.2%) was obtained for a deposition temperature of ~28° C. which corresponded to a nanofibre content of ~75% wt.

Figure 22:
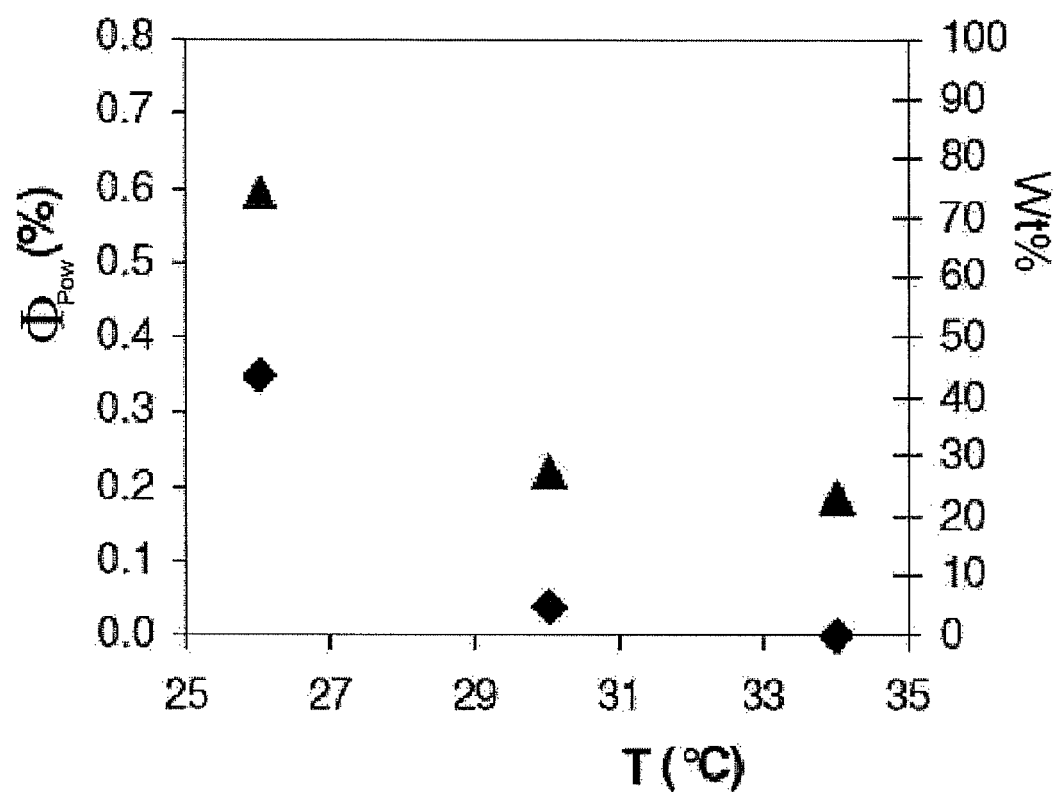
FIG. 22 is a graph showing on one hand the power efficiency (%) versus the temperature $T_3$ and, on another hand, the crystalline nanofibre content (wt %) for layers of P39T (0.5 wt %) dispersed in pinane in the presence of PCBM (0.5 wt %). PCBM was added from a 4% solution in 1,2,4-trimethylbenzene.

In FIG. 22, the power efficiency (triangles) and the nanofibre content (diamonds) (in the nanofibre-forming polymer) of further devices was correlated with the deposition temperature. In FIG. 22, a P39T:PCBM 1:1 mixture is used dispersed in pinane. The concentration in P39T was 0.5%. The PCBM was added from a solution in 1,2,4-trimethylbenzene (4%). The maximum power efficiency (~0.6%) was obtained for a deposition temperature of ~26° C. which corresponded to a nanofibre content of ~43% wt.

Figure 23:
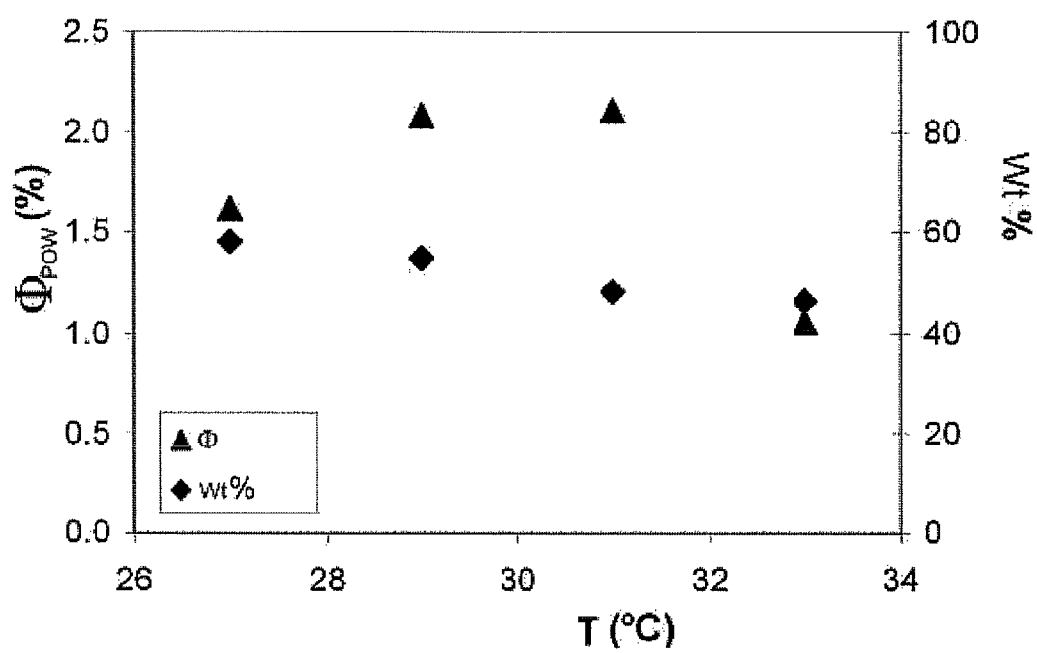
FIG. 23 is a graph showing the power efficiency (%) versus the temperature $T_3$ for layers of P38T (1.75 wt %) dispersed in pinane in the presence of PCBM (1.1 wt %). PCBM was added from a 4% solution in 1,2,4-trimethylbenzene.

In FIG. 23, the power efficiency (triangles) and the nanofibre content (diamonds) (in the nanofibre-forming polymer) of further devices was correlated with the deposition temperature. In FIG. 23, a P38T:PCBM 1:0.65 mixture is used dispersed in pinane. The concentration in P38T was 1.75%. The PCBM was added from a solution in 1,2,4-trimethylbenzene (4%).

The table below shows some experimental conditions used according to embodiments of the present invention for P3mT fibre preparation wherein m is the length of the alkyl chain in the 3 position of the thiophene units.

| A | solvent | $T_{m,d}/°C$ | $T_2/°C$ | $T_1/°C$ | $T_3/°C$ |
|---|---|---|---|---|---|
| 3 | 1,2,4-trichlorobenzene | 175 | 20 | 140 | 21-139 |
| 4 | tetralin | 150 | 20 | 100 | 21-99 |
| 4 | o-chlorotoluene | 120 | 20 | 90 | 21-89 |
| 5 | p-xylene | 120 | 20 | 80 | 21-79 |
| 6 | p-xylene | 110 | 20 | 70 | 21-69 |
| 7 | cis/trans-decalin | 120 | 20 | 50 | 21-49 |
| 7 | pinane | 120 | 20 | 70 | 21-69 |
| 8 | pinane | 110 | 20 | 70 | 21-69 |
| 9 | pinane | 110 | 20 | 60 | 21-59 |

The table below summarises some power efficiencies that were obtained via embodiments of the present invention. P34T (oCT), P35T (p-xylene), P36T (p-xylene), P37T (pinane), P38T (pinane) and P39T (pinane) in the table below correspond to the experimental conditions of lines (iii) with T3=63° C., (iv) with T3=74° C., (v) with T3=45° C., (vii) with T3=46° C., (viii) with T3=28° C. and (ix) with T3=26° C. in the table above.

| Material (solvent) | Solar cell efficiency | Active layer morphology |
|---|---|---|
| P34T (oCT) | $\eta \approx 1.9\%$ | No clear morphology changes |
| P35T (p-xylene) | $\eta \approx 2.4\%$ | Small decrease in #fibers visible in diffraction patterns |
| P36T (p-xylene) | $\eta \approx 3.2\%$ | Formation of PCBM needles (Oswald ripening) |
| P37T (pinane) | $\eta \approx 1.4\%$ | Small PCBM chunks |
| P38T (pinane) | $\eta \approx 1.2\%$ | |
| P39T (pinane) | $\eta \approx 0.60\%$ | |

The third column of the above table summarizes observations made on the TEM images of the respective active layers.
P34T: No clear morphology changes means that the morphology of the active layer did not change significantly for higher solution temperature $T_3$.
P35T: The small decrease in the number of fibers for higher solution temperature $T_3$ is visible in the Selected Area Electron Diffraction patterns, taken with TEM.
P36T: For low solution temperatures $T_3$, PCBM needles are visible in the processed layer but for higher T3, the PCBM dissolves and is mixed well with P36T (so the PCBM needles disappear in the TEM images)
P37T, P38T, P39T: Pinane is not a good solvent for PCBM so PCBM clusters form in this solvent (visible on the TEM images). For higher $T_3$, the PCBM chunks dissolve slowly (they become smaller or disappear).

These observations explain in part the low efficiencies obtained for some polythiophene derivatives.

Figure 24:
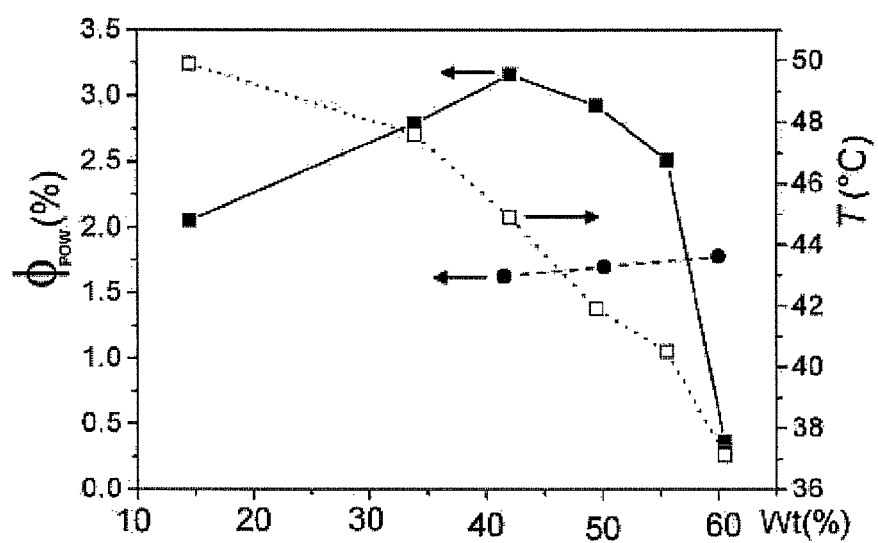
FIG. 24 is a graph showing the power efficiency (%) (black squares) of P36T/PCBM films and the temperature T3 (white squares) at which said P36T/PCBM films where casted versus the crystalline nanofibre content (%) of said P36T/PCBM films obtained according to embodiments of the present invention. It also shows the power efficiency (%) (black circles) of P36T/PCBM films obtained according to the prior art.

In FIG. 24, the graph is showing the power efficiency (%) (black squares) of P36T/PCBM films and the temperature T3 (white squares) at which said P36T/PCBM films where casted versus the crystalline nanofibre content (%) of said P36T/PCBM films obtained according to embodiments of the present invention. It also shows the power efficiency (%) (black circles) of P36T/PCBM films obtained according to the method described in WO2007/048909. It appears in this graph that a surprisingly higher efficiency is observed for P36T/PCBM films produced according to embodiments of the present invention for most of the fiber content range.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Steps may be added or deleted to methods described within the scope of the present invention.

The invention claimed is:

1. A method for producing a layer for use as an active layer in an organic electronic device, comprising:
 a) heating a nanofiber-forming polymer in a solvent to a temperature $T_1$ to yield a solution; thereafter
 b) cooling the solution down to a temperature $T_2$ at a rate less than 40° C/h, whereby a dispersion comprising crystalline nanofibers is formed; thereafter
 c) heating the dispersion to a temperature $T_3$ higher than temperature $T_2$, but lower than temperature $T_1$; and thereafter
 d) coating the dispersion on a substrate at the temperature $T_3$, whereby a layer configured for use as an element of an organic electronic device is obtained,
 wherein an electron acceptor is added to the solution or dispersion before step d) is conducted.

2. The method of claim 1, wherein the dispersion is maintained at the temperature $T_3$ for a period of time long enough to achieve a stable crystalline nanofiber content in the dispersion.

3. The method of claim 1, wherein the nanofiber-forming polymer is a conjugated polymer.

4. The method of claim 3, wherein the conjugated polymer is a homo-polymer or a co-polymer, and wherein the conjugated polymer is a ladder-type poly(p-phenylene) or is prepared from one or more monomers selected from the group consisting of thiophenes, selenophenes, thienylenevinylenes, phenylenes, phenylenevinylenes, anilines, fluorenes and indenofluorenes.

5. The method of claim 3, wherein the conjugated polymer is an electron donor polymer and/or is a hole-conducting polymer.

6. The method of claim 1, wherein the organic electronic device is a photovoltaic device.

7. The method of claim 5, wherein the conjugated polymer has the following general formula (I):

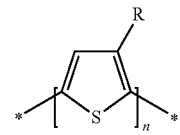

wherein R is selected from the group consisting of hydrogen, a branched $C_1$-$C_{10}$ alkyl group, a linear $C_1$-$C_{10}$ alkyl group, and a $C_5$-$C_{10}$ cyclic alkyl group, and wherein n is an integer.

8. The method of claim 1, wherein the electron acceptor is a fullerene derivative.

9. The method of claim 1, wherein the electron acceptor is [6,6]-phenyl-$C_{61}$-butyric acid methyl ester.

10. The method of claim 1, wherein no annealing is performed after step d).

11. The method of claim 1, further comprising dissolving an amorphous polymer in the solution or dispersion, wherein dissolving is conducted before step d).

12. The method of claim 1, wherein step b) further comprises removing non fiber-like aggregates from the solution.

13. The method of claim 1, wherein a ratio of crystalline nanofibers to dissolved nanofiber-forming polymer is at least 70:30 in the dispersion.

14. The method of claim 1, wherein the temperature $T_1$ is at least 20° C. lower than a temperature $T_{m.d.}$ at which the nanofiber-forming polymer completely dissolves in the solvent.

15. The method of claim 1, wherein the temperature $T_1$ is at least 25° C. lower than a temperature $T_{m.d.}$ at which the nanofiber-forming polymer completely dissolves in the solvent.

16. The method of claim 1, wherein the temperature $T_1$ is at most 60° C. lower than a temperature $T_{m.d.}$ at which the nanofiber-forming polymer completely dissolves in the solvent.

17. The method of claim 1, wherein the temperature $T_1$ is at most 50° C. lower than a temperature $T_{m.d.}$ at which the nanofiber-forming polymer completely dissolves in the solvent.

18. The method of claim 1, wherein the temperature $T_1$ is at least 50° C.

19. The method of claim 1, wherein the temperature $T_1$ is at least 60° C.

20. The method of claim 1, wherein the temperature $T_1$ is such that the nanofiber-forming polymer at least partially dissolves in the solvent.

21. The method of claim 1, wherein the temperature $T_1$ is such that the nanofiber-forming polymer only partially dissolves in the solvent.

22. The method of claim 1, wherein the temperature $T_1$ is such that aggregated nanofiber-forming polymer comprises less than 5% of the solution, as measured by UV-Vis spectroscopy.

23. The method of claim 1, wherein the temperature $T_1$ is such that aggregated nanofiber-forming polymer comprises less than 1% of the solution, as measured by UV-Vis spectroscopy.

24. The method of claim 1, wherein the temperature $T_1$ is such that aggregated nanofiber-forming polymer comprises less than 0.1% of the solution, as measured by UV-Vis spectroscopy.

25. The method of claim 1, wherein the temperature $T_1$ is such that the solution is turbid or not limpid.

26. The method of claim 1, wherein the temperature $T_2$ is from 0° C. to 25° C.

27. The method of claim 1, wherein the temperature $T_2$ is from 18° C. to 25° C.

* * * * *